(12) United States Patent  
Shuey

(10) Patent No.: US 9,793,716 B2  
(45) Date of Patent: Oct. 17, 2017

(54) POWER METER DISCONNECT SWITCH OPERATION

(71) Applicant: Elster Solutions, LLC, Raleigh, NC (US)

(72) Inventor: Kenneth C. Shuey, Zebulon, NC (US)

(73) Assignee: Elster Solutions, LLC, Raleigh, NC (US)

( * ) Notice: Subject to any disclaimer, the term of this patent is extended or adjusted under 35 U.S.C. 154(b) by 562 days.

(21) Appl. No.: 14/260,459

(22) Filed: Apr. 24, 2014

(65) Prior Publication Data

US 2015/0309545 A1    Oct. 29, 2015

(51) Int. Cl.

| | |
|---|---|
| *G06F 1/26* | (2006.01) |
| *H02J 4/00* | (2006.01) |
| *H02J 13/00* | (2006.01) |
| *G01R 35/00* | (2006.01) |
| *G01R 21/06* | (2006.01) |
| *G01R 21/133* | (2006.01) |
| *G01R 22/06* | (2006.01) |

(52) U.S. Cl.
CPC ............ *H02J 4/00* (2013.01); *H02J 13/0079* (2013.01); *G01R 21/06* (2013.01); *G01R 21/133* (2013.01); *G01R 22/063* (2013.01); *G01R 35/00* (2013.01); *Y02B 70/3225* (2013.01); *Y04S 20/222* (2013.01)

(58) Field of Classification Search
CPC .................................... G06F 1/26; G06F 1/28
See application file for complete search history.

(56) References Cited

U.S. PATENT DOCUMENTS

| | | |
|---|---|---|
| 5,808,851 A | 9/1998 | Birrell |
| 5,821,642 A | 10/1998 | Nishhira et al. |
| 5,835,331 A | 11/1998 | Shuey |
| 5,940,009 A | 8/1999 | Loy et al. |
| 6,233,132 B1 | 5/2001 | Jenski |
| 6,404,171 B2 | 6/2002 | Saida |
| 7,091,878 B2 | 8/2006 | Holle et al. |
| 7,362,232 B2 | 4/2008 | Holle et al. |
| 7,545,135 B2 | 6/2009 | Holle et al. |
| 7,746,054 B2 | 6/2010 | Shuey |
| 7,772,812 B2 | 8/2010 | Shuey |
| 7,772,829 B2 | 8/2010 | Shuey |
| 7,944,660 B2 | 5/2011 | Kumfer et al. |

(Continued)

FOREIGN PATENT DOCUMENTS

| | | |
|---|---|---|
| EP | 0108538 A1 | 5/1984 |
| EP | 1006539 | 6/2000 |

(Continued)

*Primary Examiner* — Jeffrey Shin
(74) *Attorney, Agent, or Firm* — Baker & Hostetler LLP

(57) ABSTRACT

Techniques are disclosed herein for improved power meter disconnect switch operation, which may include opening and/or closing of the disconnect switch. In particular, for reasons such as reduction of electromechanical stress on the disconnect switch, the disconnect switch may be operated based, at least in part, on a voltage at the load side of the disconnect switch. For example, in some cases, the disconnect switch may be opened slightly before a zero crossover of a waveform corresponding to the load side voltage. As another example, in some cases, the disconnect switch may be closed slightly before or slightly after a zero crossover of a waveform corresponding to the load side voltage.

17 Claims, 12 Drawing Sheets

(56) References Cited

U.S. PATENT DOCUMENTS

| | | |
|---|---|---|
| 8,049,642 B2 | 11/2011 | Makinson et al. |
| 8,154,841 B2 | 4/2012 | Allen et al. |
| 8,379,355 B2 | 2/2013 | Shuey |
| 2008/0204953 A1 | 8/2008 | Shuey |
| 2009/0261805 A1* | 10/2009 | Shuey ................ G01R 21/133 324/76.11 |
| 2011/0127853 A1 | 6/2011 | Fujita et al. |
| 2011/0184578 A1 | 7/2011 | Elwell et al. |
| 2012/0206851 A1 | 8/2012 | Weber |
| 2013/0057998 A1 | 3/2013 | Li et al. |

FOREIGN PATENT DOCUMENTS

| | | |
|---|---|---|
| EP | 2503343 A1 | 9/2012 |
| RU | 2050659 | 12/1995 |
| WO | WO 2006/035235 | 4/2006 |
| WO | WO 2014/053302 A1 | 4/2014 |

\* cited by examiner

POWER METER DISCONNECT SWITCH OPERATION

TECHNICAL BACKGROUND

Utility companies use power meters such as electricity meters to regulate and monitor power usage. Early power meters were electromechanical in nature converting the flow of electricity through the power meter into mechanical movement. The mechanical movement was used to turn a recording device which recorded the amount of energy being used. As technology improved over the years, the design of the power meter incorporated new innovations such as increased processing capability within the meter, elimination of mechanical parts, better accuracy and the like.

The utility company has the ability to connect or disconnect the consumer from the electrical grid by opening or closing a service disconnect switch located at the power meter. In older power meters, the disconnect switch was located outside the metering device and was operated manually by a utility service technician. If the consumer failed to pay the utility company for his power usage, the utility company could discontinue power service by opening the service disconnect switch. Alternatively, if service work was being performed on the meter or consumer location, the utility company may elect to disconnect the consumer from the electrical service grid by opening the service disconnect switch.

As the power meter has evolved, the service disconnect switch was incorporated into the power meter design. By integrating the service disconnect switch into the power meter, the utility company was able to take advantage of the some of the new advancements of the power meter itself such as remote operation and communication. Remotely operating the service disconnect switch removes the need for manual intervention when disconnecting power to the consumer. Once the disconnect switch is opened, the flow of power to the consumer is interrupted.

Typically, the utility meter contains signal processing circuitry that monitors the source side of the utility meter when determining power usage. In some utility meters this may involve a signal processing circuit receiving more than two inputs which may sample inputs from several different source side and load side contacts. In addition, the monitoring circuitry also monitors the load side contacts for possible tampering conditions. If the service disconnect switch is open, and the signal processing circuitry detects the presence of an alternate voltage source on the load side of the utility meter, processing circuitry within the meter may determine that there is a possible tampering condition at the power meter. Should the service disconnect switch be closed without removing the alternate voltage source, a dangerous line condition may exist. Before closing the service disconnect switch, the utility company may notify the customer that an alternate voltage source has been detected and that before power can be restored, the alternative power source must be removed.

Electromechanical switches are now being installed into the majority of all smart meters that are used in residential applications. These switches may have, for example, a 200 amp rating in order to handle the full service current capability. The physical size of the switch used in power meters is often being reduced as much as possible in order to reduce the cost of materials and manufacturing. As a result of the high current rating and reduced size, there is considerable stress placed on the device during opening and closing operations. Since the alternating current (AC) waveform spends the majority of its cycle at or near the peak, the probability is that a random switch operation at full load will have a high current to close into or open. Today's switches tend to open and close randomly with respect to the residential AC voltage and the residential AC current.

SUMMARY OF THE DISCLOSURE

Techniques are disclosed herein for improved power meter disconnect switch operation, which may include opening and/or closing of the disconnect switch. In particular, for reasons such as reduction of electromechanical stress on the disconnect switch, the disconnect switch may be operated based, at least in part, on a voltage at the load side of the disconnect switch. For example, in some cases, the disconnect switch may be opened slightly before a zero crossover of a waveform corresponding to the load side voltage. As another example, in some cases, the disconnect switch may be closed slightly before or slightly after a zero crossover of a waveform corresponding to the load side voltage. In some cases, a request may be received to operate the disconnect switch. The request may, for example, be received by the power meter from a remote utility control component. A determination may be made, based, at least in part, on the load side voltage, of when to issue a command to operate the disconnect switch. The command to operate the disconnect switch may be issued, and the disconnect switch may then be responsively operated.

Other features and advantages of the described embodiments may become apparent from the following detailed description and accompanying drawings.

BRIEF DESCRIPTION OF THE DRAWINGS

The foregoing summary, as well as the following detailed description of various embodiments, is better understood when read in conjunction with the appended drawings. For the purpose of illustrating the invention, there are shown in the drawings exemplary embodiments of various aspects of the invention; however, the invention is not limited to the specific methods and instrumentalities disclosed. In the drawings.

DETAILED DESCRIPTION OF ILLUSTRATIVE EMBODIMENTS

Exemplary systems and methods for gathering meter data are described below. It will be appreciated by those of ordinary skill in the art that the description given herein with respect to those figures is for exemplary purposes only and is not intended in any way to limit the scope of potential embodiments.

Generally, a plurality of meter devices, which operate to track usage of a service or commodity such as, for example, electricity, water, and gas, are operable to wirelessly communicate. One or more devices, referred to herein as "collectors," are provided that "collect" data transmitted by the other meter devices so that it can be accessed by other computer systems. The collectors receive and compile metering data from a plurality of meter devices via wireless communications. A data collection server may communicate with the collectors to retrieve the compiled meter data.

Figure 1:
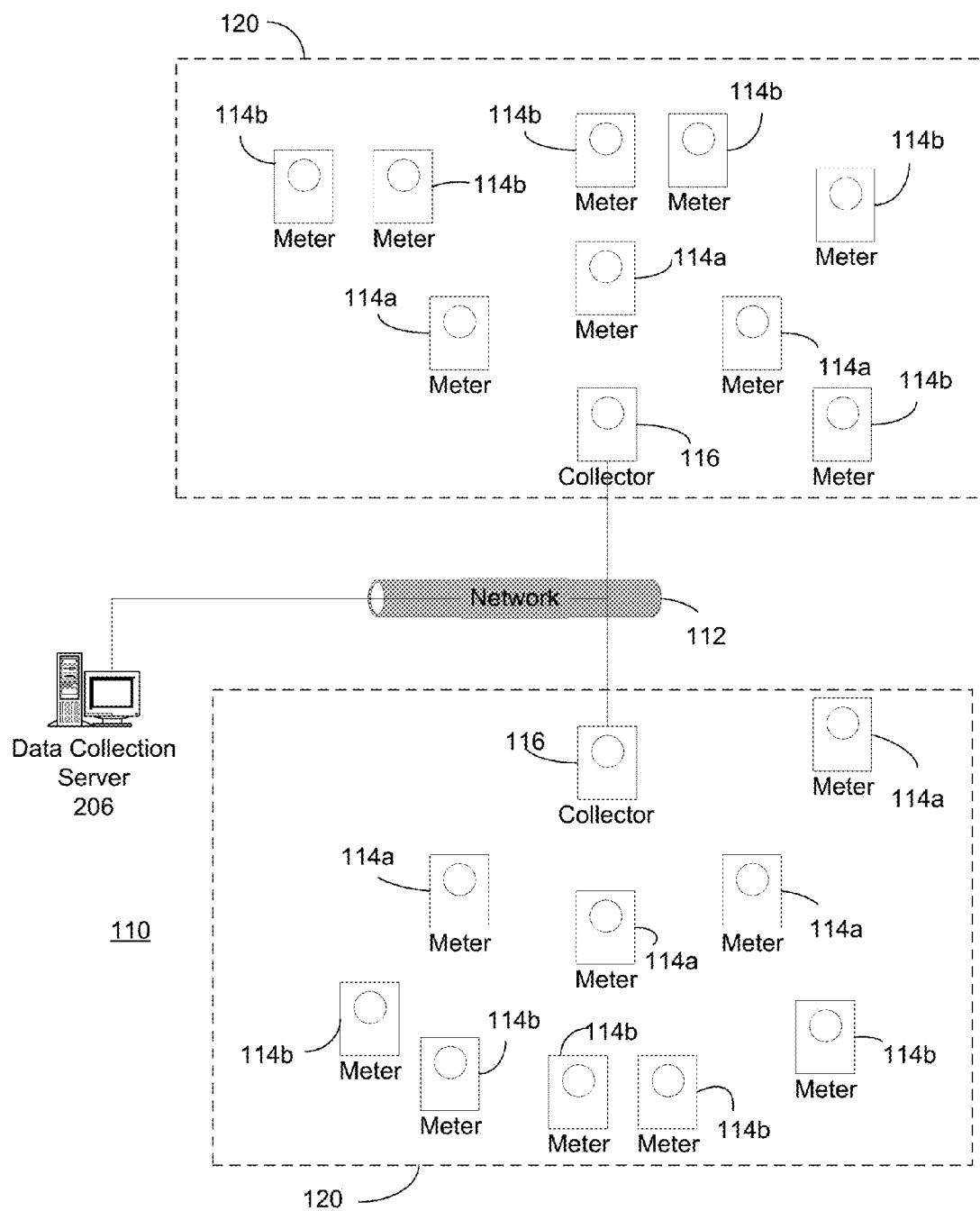
FIG. 1 is a diagram of an exemplary metering system.

FIG. 1 provides a diagram of one exemplary metering system 110. System 110 comprises a plurality of meters 114, which are operable to sense and record consumption or usage of a service or commodity such as, for example, electricity, water, or gas. Meters 114 may be located at customer premises such as, for example, a home or place of business. Meters 114 comprise circuitry for measuring the consumption of the service or commodity being consumed at their respective locations and for generating data reflecting the consumption, as well as other data related thereto. Meters 114 may also comprise circuitry for wirelessly transmitting data generated by the meter to a remote location. Meters 114 may further comprise circuitry for receiving data, commands or instructions wirelessly as well. Meters that are operable to both receive and transmit data may be referred to as "bi-directional" or "two-way" meters, while meters that are only capable of transmitting data may be referred to as "transmit-only" or "one-way" meters. In bi-directional meters, the circuitry for transmitting and receiving may comprise a transceiver. In an illustrative embodiment, meters 114 may be, for example, electricity meters manufactured by Elster Solutions, LLC and marketed under the tradename REX.

System 110 further comprises collectors 116. In one embodiment, collectors 116 are also meters operable to detect and record usage of a service or commodity such as, for example, electricity, water, or gas. In addition, collectors 116 are operable to send data to and receive data from meters 114. Thus, like the meters 114, the collectors 116 may comprise both circuitry for measuring the consumption of a service or commodity and for generating data reflecting the consumption and circuitry for transmitting and receiving data. In one embodiment, collector 116 and meters 114 communicate with and amongst one another using any one of several wireless techniques such as, for example, frequency hopping spread spectrum (FHSS) and direct sequence spread spectrum (DSSS).

A collector 116 and the meters 114 with which it communicates define a subnet/LAN 120 of system 110. As used herein, meters 114 and collectors 116 may be referred to as "nodes" in the subnet 120. In each subnet/LAN 120, each meter transmits data related to consumption of the commodity being metered at the meter's location. The collector 116 receives the data transmitted by each meter 114, effectively "collecting" it, and then periodically transmits the data from all of the meters in the subnet/LAN 120 to a data collection server 206. The data collection server 206 stores the data for analysis and preparation of bills, for example. The data collection server 206 may be a specially programmed general purpose computing system and may communicate with collectors 116 via a network 112. The network 112 may comprise any form of network, including a wireless network or a fixed-wire network, such as a local area network (LAN), a wide area network, the Internet, an intranet, a telephone network, such as the public switched telephone network (PSTN), a Frequency Hopping Spread Spectrum (FHSS) radio network, a mesh network, a Wi-Fi (802.11) network, a Wi-Max (802.16) network, a land line (POTS) network, or any combination of the above.

Figure 2:
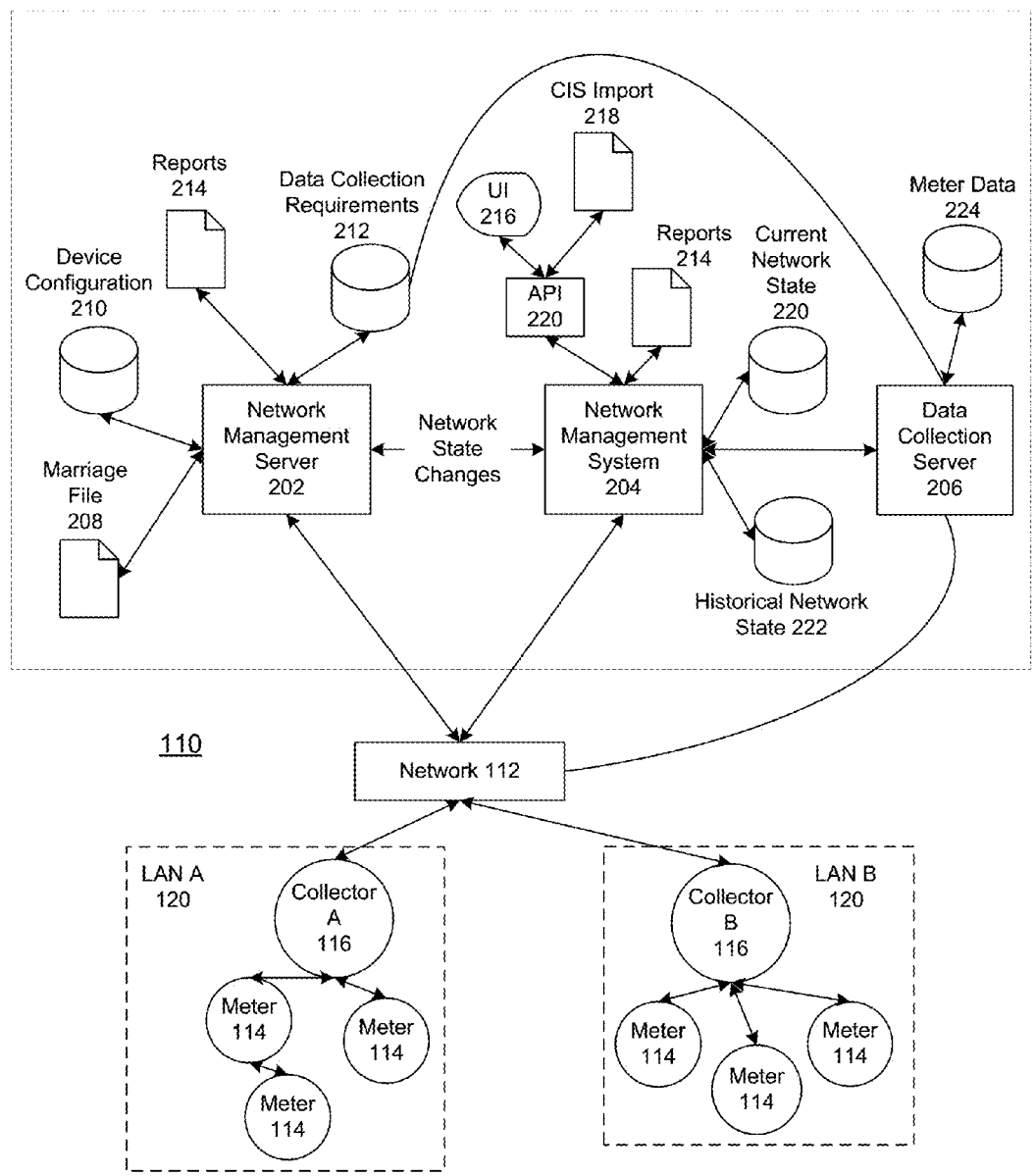
FIG. 2 expands upon the diagram of FIG. 1 and illustrates an exemplary metering system in greater detail.

Referring now to FIG. 2, further details of the metering system 110 are shown. Typically, the system will be operated by a utility company or a company providing information technology services to a utility company. As shown, the system 110 comprises a network management server 202, a network management system (NMS) 204 and the data collection server 206 that together manage one or more subnets/LANs 120 and their constituent nodes. The NMS 204 tracks changes in network state, such as new nodes registering/unregistering with the system 110, node communication paths changing, etc. This information is collected for each subnet/LAN 120 and is detected and forwarded to the network management server 202 and data collection server 206.

Each of the meters 114 and collectors 116 is assigned an identifier (LAN ID) that uniquely identifies that meter or collector on its subnet/LAN 120. In this embodiment, communication between nodes (i.e., the collectors and meters) and the system 110 is accomplished using the LAN ID. However, it is preferable for operators of a utility to query and communicate with the nodes using their own identifiers. To this end, a marriage file 208 may be used to correlate a utility's identifier for a node (e.g., a utility serial number) with both a manufacturer serial number (i.e., a serial number assigned by the manufacturer of the meter) and the LAN ID for each node in the subnet/LAN 120. In this manner, the utility can refer to the meters and collectors by the utilities identifier, while the system can employ the LAN ID for the purpose of designating particular meters during system communications.

A device configuration database 210 stores configuration information regarding the nodes. For example, in the metering system 110, the device configuration database may include data regarding time of use (TOU) switchpoints, etc. for the meters 114 and collectors 116 communicating in the system 110. A data collection requirements database 212 contains information regarding the data to be collected on a per node basis. For example, a utility may specify that metering data such as load profile, demand, TOU, etc. is to be collected from particular meter(s) 114a. Reports 214 containing information on the network configuration may be automatically generated or in accordance with a utility request.

The network management system (NMS) 204 maintains a database describing the current state of the global fixed network system (current network state 220) and a database describing the historical state of the system (historical network state 222). The current network state 220 contains data regarding current meter-to-collector assignments, etc. for each subnet/LAN 120. The historical network state 222 is a database from which the state of the network at a particular point in the past can be reconstructed. The NMS 204 is responsible for, amongst other things, providing reports 214 about the state of the network. The NMS 204 may be accessed via an API 220 that is exposed to a user interface 216 and a Customer Information System (CIS)

218. Other external interfaces may also be implemented. In addition, the data collection requirements stored in the database 212 may be set via the user interface 216 or CIS 218.

The data collection server 206 collects data from the nodes (e.g., collectors 116) and stores the data in a database 224. The data includes metering information, such as energy consumption and may be used for billing purposes, etc. by a utility provider.

The network management server 202, network management system 204 and data collection server 206 communicate with the nodes in each subnet/LAN 120 via network 110.

Figure 3A:
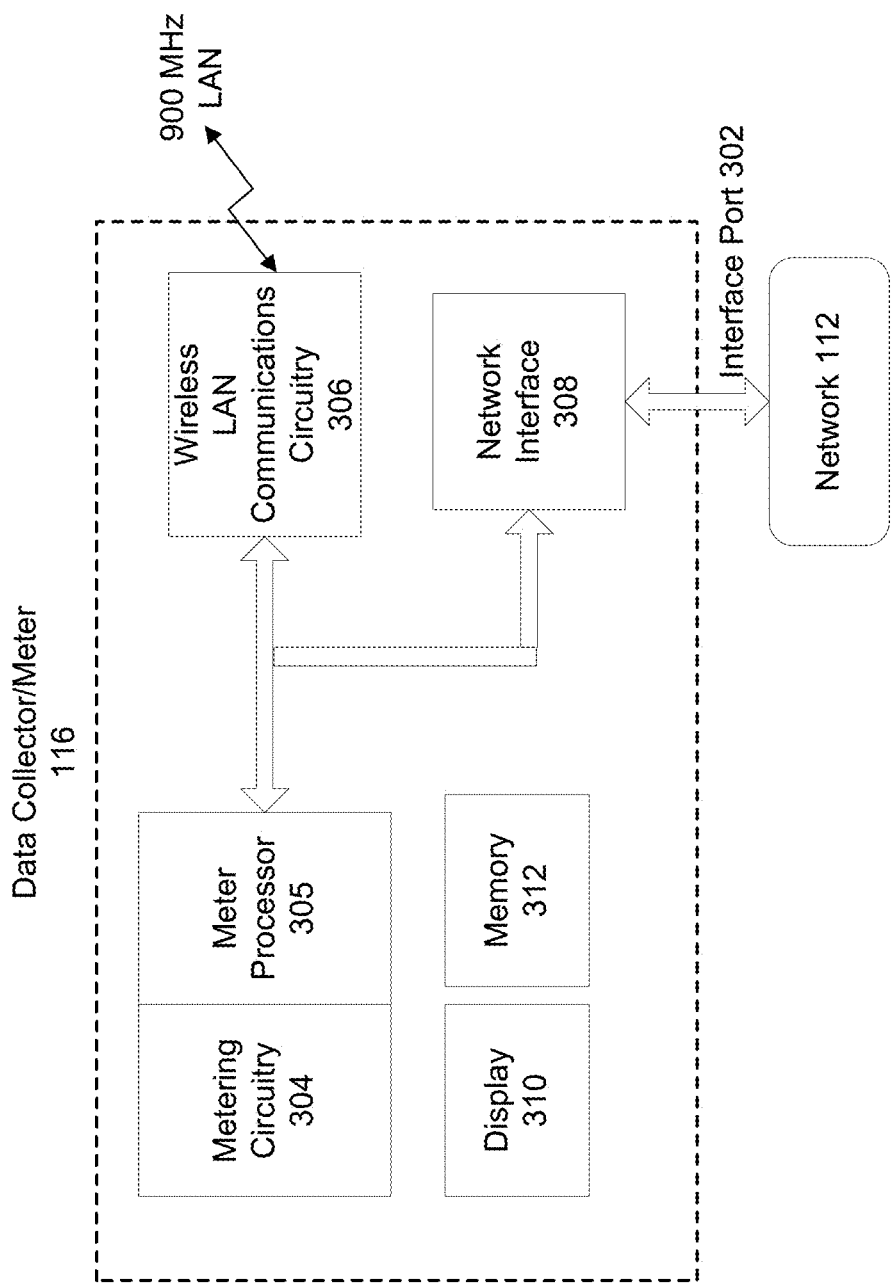
FIG. 3A is a block diagram illustrating an exemplary collector.

FIG. 3A is a block diagram illustrating further details of one embodiment of a collector 116. Although certain components are designated and discussed with reference to FIG. 3A, it should be appreciated that the invention is not limited to such components. In fact, various other components typically found in an electronic meter may be a part of collector 116, but have not been shown in FIG. 3A for the purposes of clarity and brevity. Also, the invention may use other components to accomplish the operation of collector 116. The components that are shown and the functionality described for collector 116 are provided as examples, and are not meant to be exclusive of other components or other functionality.

As shown in FIG. 3A, collector 116 may comprise metering circuitry 304 that performs measurement of consumption of a service or commodity and a processor 305 that controls the overall operation of the metering functions of the collector 116. The collector 116 may further comprise a display 310 for displaying information such as measured quantities and meter status and a memory 312 for storing data. The collector 116 further comprises wireless LAN communications circuitry 306 for communicating wirelessly with the meters 114 in a subnet/LAN and a network interface 308 for communication over the network 112.

In one embodiment, the metering circuitry 304, processor 305, display 310 and memory 312 are implemented using an A3 ALPHA meter available from Elster Electricity, Inc. In that embodiment, the wireless LAN communications circuitry 306 may be implemented by a LAN Option Board (e.g., a 900 MHz two-way radio) installed within the A3 ALPHA meter, and the network interface 308 may be implemented by a WAN Option Board (e.g., a telephone modem) also installed within the A3 ALPHA meter. In this embodiment, the WAN Option Board 308 routes messages from network 112 (via interface port 302) to either the meter processor 305 or the LAN Option Board 306. LAN Option Board 306 may use a transceiver (not shown), for example a 900 MHz radio, to communicate data to meters 114. Also, LAN Option Board 306 may have sufficient memory to store data received from meters 114. This data may include, but is not limited to the following: current billing data (e.g., the present values stored and displayed by meters 114), previous billing period data, previous season data, and load profile data.

LAN Option Board 306 may be capable of synchronizing its time to a real time clock (not shown) in A3 ALPHA meter, thereby synchronizing the LAN reference time to the time in the meter. The processing necessary to carry out the communication functionality and the collection and storage of metering data of the collector 116 may be handled by the processor 305 and/or additional processors (not shown) in the LAN Option Board 306 and the WAN Option Board 308.

The responsibility of a collector 116 is wide and varied. Generally, collector 116 is responsible for managing, processing and routing data communicated between the collector and network 112 and between the collector and meters 114. Collector 116 may continually or intermittently read the current data from meters 114 and store the data in a database (not shown) in collector 116. Such current data may include but is not limited to the total kWh usage, the Time-Of-Use (TOU) kWh usage, peak kW demand, and other energy consumption measurements and status information. Collector 116 also may read and store previous billing and previous season data from meters 114 and store the data in the database in collector 116. The database may be implemented as one or more tables of data within the collector 116.

Figure 3B:
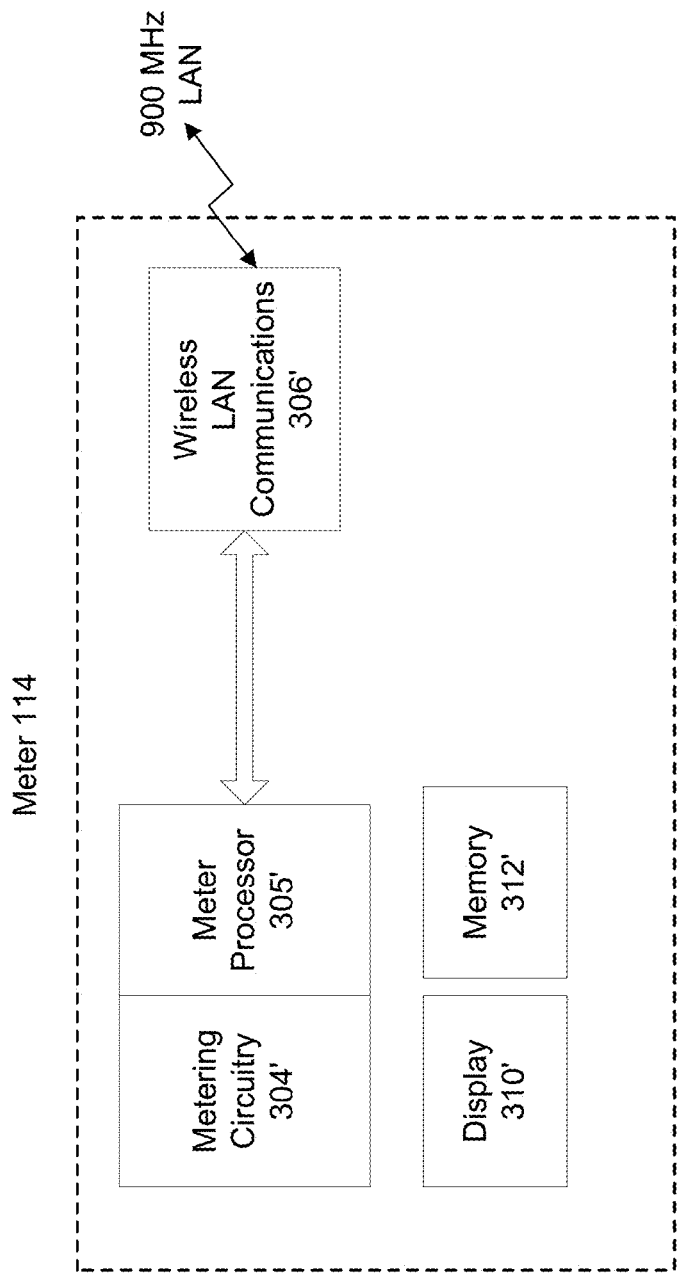
FIG. 3B is a block diagram illustrating an exemplary meter.

FIG. 3B is a block diagram of an exemplary embodiment of a meter 114 that may operate in the system 110 of FIGS. 1 and 2. As shown, the meter 114 comprises metering circuitry 304' for measuring the amount of a service or commodity that is consumed, a processor 305' that controls the overall functions of the meter, a display 310' for displaying meter data and status information, and a memory 312' for storing data and program instructions. The meter 114 further comprises wireless communications circuitry 306' for transmitting and receiving data to/from other meters 114 or a collector 116.

Referring again to FIG. 1, in the exemplary embodiment shown, a collector 116 directly communicates with only a subset of the plurality of meters 114 in its particular subnet/LAN. Meters 114 with which collector 116 directly communicates may be referred to as "level one" meters 114a. The level one meters 114a are said to be one "hop" from the collector 116. Communications between collector 116 and meters 114 other than level one meters 114a are relayed through the level one meters 114a. Thus, the level one meters 114a operate as repeaters for communications between collector 116 and meters 114 located further away in subnet 120.

Each level one meter 114a typically will only be in range to directly communicate with only a subset of the remaining meters 114 in the subnet 120. The meters 114 with which the level one meters 114a directly communicate may be referred to as level two meters 114b. Level two meters 114b are one "hop" from level one meters 114a, and therefore two "hops" from collector 116. Level two meters 114b operate as repeaters for communications between the level one meters 114a and meters 114 located further away from collector 116 in the subnet 120.

While only three levels of meters are shown (collector 116, first level 114a, second level 114b) in FIG. 1, a subnet 120 may comprise any number of levels of meters 114. For example, a subnet 120 may comprise one level of meters but might also comprise eight or more levels of meters 114. In an embodiment wherein a subnet comprises eight levels of meters 114, as many as 1024 meters might be registered with a single collector 116.

As mentioned above, each meter 114 and collector 116 that is installed in the system 110 has a unique identifier (LAN ID) stored thereon that uniquely identifies the device from all other devices in the system 110. Additionally, meters 114 operating in a subnet 120 comprise information including the following: data identifying the collector with which the meter is registered; the level in the subnet at which the meter is located; the repeater meter at the prior level with which the meter communicates to send and receive data to/from the collector; an identifier indicating whether the meter is a repeater for other nodes in the subnet; and if the meter operates as a repeater, the identifier that uniquely identifies the repeater within the particular subnet, and the number of meters for which it is a repeater. Collectors 116 have stored thereon all of this same data for all meters 114 that are registered therewith. Thus, collector 116 comprises data identifying all nodes registered therewith as well as data identifying the registered path by which data is communicated from the collector to each node. Each meter 114 therefore has a designated communications path to the collector that is either a direct path (e.g., all level one nodes) or an indirect path through one or more intermediate nodes that serve as repeaters.

Information is transmitted in this embodiment in the form of packets. For most network tasks such as, for example, reading meter data, collector 116 communicates with meters 114 in the subnet 120 using point-to-point transmissions. For example, a message or instruction from collector 116 is routed through the designated set of repeaters to the desired meter 114. Similarly, a meter 114 communicates with collector 116 through the same set of repeaters, but in reverse.

In some instances, however, collector 116 may need to quickly communicate information to all meters 114 located in its subnet 120. Accordingly, collector 116 may issue a broadcast message that is meant to reach all nodes in the subnet 120. The broadcast message may be referred to as a "flood broadcast message." A flood broadcast originates at collector 116 and propagates through the entire subnet 120 one level at a time. For example, collector 116 may transmit a flood broadcast to all first level meters 114a. The first level meters 114a that receive the message pick a random time slot and retransmit the broadcast message to second level meters 114b. Any second level meter 114b can accept the broadcast, thereby providing better coverage from the collector out to the end point meters. Similarly, the second level meters 114b that receive the broadcast message pick a random time slot and communicate the broadcast message to third level meters. This process continues out until the end nodes of the subnet. Thus, a broadcast message gradually propagates outward from the collector to the nodes of the subnet 120.

The flood broadcast packet header contains information to prevent nodes from repeating the flood broadcast packet more than once per level. For example, within a flood broadcast message, a field might exist that indicates to meters/nodes which receive the message, the level of the subnet the message is located; only nodes at that particular level may re-broadcast the message to the next level. If the collector broadcasts a flood message with a level of 1, only level 1 nodes may respond. Prior to re-broadcasting the flood message, the level 1 nodes increment the field to 2 so that only level 2 nodes respond to the broadcast. Information within the flood broadcast packet header ensures that a flood broadcast will eventually die out.

Generally, a collector 116 issues a flood broadcast several times, e.g. five times, successively to increase the probability that all meters in the subnet 120 receive the broadcast. A delay is introduced before each new broadcast to allow the previous broadcast packet time to propagate through all levels of the subnet.

Meters 114 may have a clock formed therein. However, meters 114 often undergo power interruptions that can interfere with the operation of any clock therein. Accordingly, the clocks internal to meters 114 cannot be relied upon to provide an accurate time reading. Having the correct time is necessary, however, when time of use metering is being employed. Indeed, in an embodiment, time of use schedule data may also be comprised in the same broadcast message as the time. Accordingly, collector 116 periodically flood broadcasts the real time to meters 114 in subnet 120. Meters 114 use the time broadcasts to stay synchronized with the rest of the subnet 120. In an illustrative embodiment, collector 116 broadcasts the time every 15 minutes. The broadcasts may be made near the middle of 15 minute clock boundaries that are used in performing load profiling and time of use (TOU) schedules so as to minimize time changes near these boundaries. Maintaining time synchronization is important to the proper operation of the subnet 120. Accordingly, lower priority tasks performed by collector 116 may be delayed while the time broadcasts are performed.

In an illustrative embodiment, the flood broadcasts transmitting time data may be repeated, for example, five times, so as to increase the probability that all nodes receive the time. Furthermore, where time of use schedule data is communicated in the same transmission as the timing data, the subsequent time transmissions allow a different piece of the time of use schedule to be transmitted to the nodes.

Exception messages are used in subnet 120 to transmit unexpected events that occur at meters 114 to collector 116. In an embodiment, the first 4 seconds of every 32-second period are allocated as an exception window for meters 114 to transmit exception messages. Meters 114 transmit their exception messages early enough in the exception window so the message has time to propagate to collector 116 before the end of the exception window. Collector 116 may process the exceptions after the 4-second exception window. Generally, a collector 116 acknowledges exception messages, and collector 116 waits until the end of the exception window to send this acknowledgement.

In an illustrative embodiment, exception messages are configured as one of three different types of exception messages: local exceptions, which are handled directly by the collector 116 without intervention from data collection server 206; an immediate exception, which is generally relayed to data collection server 206 under an expedited schedule; and a daily exception, which is communicated to the data collection server 206 on a regular schedule.

Exceptions are processed as follows. When an exception is received at collector 116, the collector 116 identifies the type of exception that has been received. If a local exception has been received, collector 116 takes an action to remedy the problem. For example, when collector 116 receives an exception requesting a "node scan request" such as discussed below, collector 116 transmits a command to initiate a scan procedure to the meter 114 from which the exception was received.

If an immediate exception type has been received, collector 116 makes a record of the exception. An immediate exception might identify, for example, that there has been a power outage. Collector 116 may log the receipt of the exception in one or more tables or files. In an illustrative example, a record of receipt of an immediate exception is made in a table referred to as the "Immediate Exception Log Table." Collector 116 then waits a set period of time before taking further action with respect to the immediate exception. For example, collector 116 may wait 64 seconds. This delay period allows the exception to be corrected before communicating the exception to the data collection server 206. For example, where a power outage was the cause of the immediate exception, collector 116 may wait a set period of time to allow for receipt of a message indicating the power outage has been corrected.

If the exception has not been corrected, collector 116 communicates the immediate exception to data collection server 206. For example, collector 116 may initiate a dial-up connection with data collection server 206 and download the exception data. After reporting an immediate exception to data collection server 206, collector 116 may delay reporting any additional immediate exceptions for a period of time such as ten minutes. This is to avoid reporting exceptions from other meters 114 that relate to, or have the same cause as, the exception that was just reported.

If a daily exception was received, the exception is recorded in a file or a database table. Generally, daily exceptions are occurrences in the subnet 120 that need to be reported to data collection server 206, but are not so urgent that they need to be communicated immediately. For example, when collector 116 registers a new meter 114 in subnet 120, collector 116 records a daily exception identifying that the registration has taken place. In an illustrative embodiment, the exception is recorded in a database table referred to as the "Daily Exception Log Table." Collector 116 communicates the daily exceptions to data collection server 206. Generally, collector 116 communicates the daily exceptions once every 24 hours.

In the present embodiment, a collector assigns designated communications paths to meters with bi-directional communication capability, and may change the communication paths for previously registered meters if conditions warrant. For example, when a collector 116 is initially brought into system 110, it needs to identify and register meters in its subnet 120. A "node scan" refers to a process of communication between a collector 116 and meters 114 whereby the collector may identify and register new nodes in a subnet 120 and allow previously registered nodes to switch paths. A collector 116 can implement a node scan on the entire subnet, referred to as a "full node scan," or a node scan can be performed on specially identified nodes, referred to as a "node scan retry."

A full node scan may be performed, for example, when a collector is first installed. The collector 116 must identify and register nodes from which it will collect usage data. The collector 116 initiates a node scan by broadcasting a request, which may be referred to as a Node Scan Procedure request. Generally, the Node Scan Procedure request directs that all unregistered meters 114 or nodes that receive the request respond to the collector 116. The request may comprise information such as the unique address of the collector that initiated the procedure. The signal by which collector 116 transmits this request may have limited strength and therefore is detected only at meters 114 that are in proximity of collector 116. Meters 114 that receive the Node Scan Procedure request respond by transmitting their unique identifier as well as other data.

For each meter from which the collector receives a response to the Node Scan Procedure request, the collector tries to qualify the communications path to that meter before registering the meter with the collector. That is, before registering a meter, the collector 116 attempts to determine whether data communications with the meter will be sufficiently reliable. In one embodiment, the collector 116 determines whether the communication path to a responding meter is sufficiently reliable by comparing a Received Signal Strength Indication (RSSI) value (i.e., a measurement of the received radio signal strength) measured with respect to the received response from the meter to a selected threshold value. For example, the threshold value may be −60 dBm. RSSI values above this threshold would be deemed sufficiently reliable. In another embodiment, qualification is performed by transmitting a predetermined number of additional packets to the meter, such as ten packets, and counting the number of acknowledgements received back from the meter. If the number of acknowledgments received is greater than or equal to a selected threshold (e.g., 8 out of 10), then the path is considered to be reliable. In other embodiments, a combination of the two qualification techniques may be employed.

If the qualification threshold is not met, the collector 116 may add an entry for the meter to a "Straggler Table." The entry includes the meter's LAN ID, its qualification score (e.g., 5 out of 10; or its RSSI value), its level (in this case level one) and the unique ID of its parent (in this case the collector's ID).

If the qualification threshold is met or exceeded, the collector 116 registers the node. Registering a meter 114 comprises updating a list of the registered nodes at collector 116. For example, the list may be updated to identify the meter's system-wide unique identifier and the communication path to the node. Collector 116 also records the meter's level in the subnet (i.e. whether the meter is a level one node, level two node, etc.), whether the node operates as a repeater, and if so, the number of meters for which it operates as a repeater. The registration process further comprises transmitting registration information to the meter 114. For example, collector 116 forwards to meter 114 an indication that it is registered, the unique identifier of the collector with which it is registered, the level the meter exists at in the subnet, and the unique identifier of its parent meter that will serve as a repeater for messages the meter may send to the collector. In the case of a level one node, the parent is the collector itself. The meter stores this data and begins to operate as part of the subnet by responding to commands from its collector 116.

Qualification and registration continues for each meter that responds to the collector's initial Node Scan Procedure request. The collector 116 may rebroadcast the Node Scan Procedure additional times so as to insure that all meters 114 that may receive the Node Scan Procedure have an opportunity for their response to be received and the meter qualified as a level one node at collector 116.

The node scan process then continues by performing a similar process as that described above at each of the now registered level one nodes. This process results in the identification and registration of level two nodes. After the level two nodes are identified, a similar node scan process is performed at the level two nodes to identify level three nodes, and so on.

Specifically, to identify and register meters that will become level two meters, for each level one meter, in succession, the collector 116 transmits a command to the level one meter, which may be referred to as an "Initiate Node Scan Procedure" command. This command instructs the level one meter to perform its own node scan process. The request comprises several data items that the receiving meter may use in completing the node scan. For example, the request may comprise the number of timeslots available for responding nodes, the unique address of the collector that initiated the request, and a measure of the reliability of the communications between the target node and the collector. As described below, the measure of reliability may be employed during a process for identifying more reliable paths for previously registered nodes.

The meter that receives the Initiate Node Scan Response request responds by performing a node scan process similar to that described above. More specifically, the meter broadcasts a request to which all unregistered nodes may respond. The request comprises the number of timeslots available for responding nodes (which is used to set the period for the node to wait for responses), the unique address of the collector that initiated the node scan procedure, a measure of the reliability of the communications between the sending node and the collector (which may be used in the process of determining whether a meter's path may be switched as described below), the level within the subnet of the node sending the request, and an RSSI threshold (which may also be used in the process of determining whether a registered meter's path may be switched). The meter issuing the node scan request then waits for and receives responses from unregistered nodes. For each response, the meter stores in memory the unique identifier of the responding meter. This information is then transmitted to the collector.

For each unregistered meter that responded to the node scan issued by the level one meter, the collector attempts again to determine the reliability of the communication path to that meter. In one embodiment, the collector sends a "Qualify Nodes Procedure" command to the level one node which instructs the level one node to transmit a predetermined number of additional packets to the potential level two node and to record the number of acknowledgements received back from the potential level two node. This qualification score (e.g., 8 out of 10) is then transmitted back to the collector, which again compares the score to a qualification threshold. In other embodiments, other measures of the communications reliability may be provided, such as an RSSI value.

If the qualification threshold is not met, then the collector adds an entry for the node in the Straggler Table, as discussed above. However, if there already is an entry in the Straggler Table for the node, the collector will update that entry only if the qualification score for this node scan procedure is better than the recorded qualification score from the prior node scan that resulted in an entry for the node.

If the qualification threshold is met or exceeded, the collector 116 registers the node. Again, registering a meter 114 at level two comprises updating a list of the registered nodes at collector 116. For example, the list may be updated to identify the meter's unique identifier and the level of the meter in the subnet. Additionally, the collector's 116 registration information is updated to reflect that the meter 114 from which the scan process was initiated is identified as a repeater (or parent) for the newly registered node. The registration process further comprises transmitting information to the newly registered meter as well as the meter that will serve as a repeater for the newly added node. For example, the node that issued the node scan response request is updated to identify that it operates as a repeater and, if it was previously registered as a repeater, increments a data item identifying the number of nodes for which it serves as a repeater. Thereafter, collector 116 forwards to the newly registered meter an indication that it is registered, an identification of the collector 116 with which it is registered, the level the meter exists at in the subnet, and the unique identifier of the node that will serve as its parent, or repeater, when it communicates with the collector 116.

The collector then performs the same qualification procedure for each other potential level two node that responded to the level one node's node scan request. Once that process is completed for the first level one node, the collector initiates the same procedure at each other level one node until the process of qualifying and registering level two nodes has been completed at each level one node. Once the node scan procedure has been performed by each level one node, resulting in a number of level two nodes being registered with the collector, the collector will then send the Initiate Node Scan Response command to each level two node, in turn. Each level two node will then perform the same node scan procedure as performed by the level one nodes, potentially resulting in the registration of a number of level three nodes. The process is then performed at each successive node, until a maximum number of levels is reached (e.g., seven levels) or no unregistered nodes are left in the subnet.

It will be appreciated that in the present embodiment, during the qualification process for a given node at a given level, the collector qualifies the last "hop" only. For example, if an unregistered node responds to a node scan request from a level four node, and therefore, becomes a potential level five node, the qualification score for that node is based on the reliability of communications between the level four node and the potential level five node (i.e., packets transmitted by the level four node versus acknowledgments received from the potential level five node), not based on any measure of the reliability of the communications over the full path from the collector to the potential level five node. In other embodiments, of course, the qualification score could be based on the full communication path.

At some point, each meter will have an established communication path to the collector which will be either a direct path (i.e., level one nodes) or an indirect path through one or more intermediate nodes that serve as repeaters. If during operation of the network, a meter registered in this manner fails to perform adequately, it may be assigned a different path or possibly to a different collector as described below.

As previously mentioned, a full node scan may be performed when a collector 116 is first introduced to a network. At the conclusion of the full node scan, a collector 116 will have registered a set of meters 114 with which it communicates and reads metering data. Full node scans might be periodically performed by an installed collector to identify new meters 114 that have been brought on-line since the last node scan and to allow registered meters to switch to a different path.

In addition to the full node scan, collector 116 may also perform a process of scanning specific meters 114 in the subnet 120, which is referred to as a "node scan retry." For example, collector 116 may issue a specific request to a meter 114 to perform a node scan outside of a full node scan when on a previous attempt to scan the node, the collector 116 was unable to confirm that the particular meter 114 received the node scan request. Also, a collector 116 may request a node scan retry of a meter 114 when during the course of a full node scan the collector 116 was unable to read the node scan data from the meter 114. Similarly, a node scan retry will be performed when an exception procedure requesting an immediate node scan is received from a meter 114.

The system 110 also automatically reconfigures to accommodate a new meter 114 that may be added. More particularly, the system identifies that the new meter has begun operating and identifies a path to a collector 116 that will become responsible for collecting the metering data. Specifically, the new meter will broadcast an indication that it is unregistered. In one embodiment, this broadcast might be, for example, embedded in, or relayed as part of a request for an update of the real time as described above. The broadcast will be received at one of the registered meters 114 in proximity to the meter that is attempting to register. The registered meter 114 forwards the time to the meter that is attempting to register. The registered node also transmits an exception request to its collector 116 requesting that the collector 116 implement a node scan, which presumably will locate and register the new meter. The collector 116 then transmits a request that the registered node perform a node scan. The registered node will perform the node scan, during which it requests that all unregistered nodes respond. Presumably, the newly added, unregistered meter will respond to the node scan. When it does, the collector will then attempt to qualify and then register the new node in the same manner as described above.

Once a communication path between the collector and a meter is established, the meter can begin transmitting its meter data to the collector and the collector can transmit data and instructions to the meter. As mentioned above, data is transmitted in packets. "Outbound" packets are packets transmitted from the collector to a meter at a given level. In one embodiment, outbound packets contain the following fields, but other fields may also be included:

Length—the length of the packet;
SrcAddr—source address—in this case, the ID of the collector;
DestAddr—the LAN ID of the meter to which the packet addressed;
RptPath—the communication path to the destination meter (i.e., the list of identifiers of each repeater in the path from the collector to the destination node); and
Data—the payload of the packet.

The packet may also include integrity check information (e.g., CRC), a pad to fill-out unused portions of the packet and other control information. When the packet is transmitted from the collector, it will only be forwarded on to the destination meter by those repeater meters whose identifiers appear in the RptPath field. Other meters that may receive the packet, but that are not listed in the path identified in the RptPath field will not repeat the packet.

"Inbound" packets are packets transmitted from a meter at a given level to the collector. In one embodiment, inbound packets contain the following fields, but other fields may also be included:

Length—the length of the packet;
SrcAddr—source address—the address of the meter that initiated the packet;
DestAddr—the ID of the collector to which the packet is to be transmitted;
RptAddr—the ID of the parent node that serves as the next repeater for the sending node;
Data—the payload of the packet;

Because each meter knows the identifier of its parent node (i.e., the node in the next lower level that serves as a repeater for the present node), an inbound packet need only identify who is the next parent. When a node receives an inbound packet, it checks to see if the RptAddr matches its own identifier. If not, it discards the packet. If so, it knows that it is supposed to forward the packet on toward the collector. The node will then replace the RptAddr field with the identifier of its own parent and will then transmit the packet so that its parent will receive it. This process will continue through each repeater at each successive level until the packet reaches the collector.

For example, suppose a meter at level three initiates transmission of a packet destined for its collector. The level three node will insert in the RptAddr field of the inbound packet the identifier of the level two node that serves as a repeater for the level three node. The level three node will then transmit the packet. Several level two nodes may receive the packet, but only the level two node having an identifier that matches the identifier in the RptAddr field of the packet will acknowledge it. The other will discard it. When the level two node with the matching identifier receives the packet, it will replace the RptAddr field of the packet with the identifier of the level one packet that serves as a repeater for that level two packet, and the level two packet will then transmit the packet. This time, the level one node having the identifier that matches the RptAddr field will receive the packet. The level one node will insert the identifier of the collector in the RptAddr field and will transmit the packet. The collector will then receive the packet to complete the transmission.

A collector 116 periodically retrieves meter data from the meters that are registered with it. For example, meter data may be retrieved from a meter every 4 hours. Where there is a problem with reading the meter data on the regularly scheduled interval, the collector will try to read the data again before the next regularly scheduled interval. Nevertheless, there may be instances wherein the collector 116 is unable to read metering data from a particular meter 114 for a prolonged period of time. The meters 114 store an indication of when they are read by their collector 116 and keep track of the time since their data has last been collected by the collector 116. If the length of time since the last reading exceeds a defined threshold, such as for example, 18 hours, presumably a problem has arisen in the communication path between the particular meter 114 and the collector 116. Accordingly, the meter 114 changes its status to that of an unregistered meter and attempts to locate a new path to a collector 116 via the process described above for a new node. Thus, the exemplary system is operable to reconfigure itself to address inadequacies in the system.

In some instances, while a collector 116 may be able to retrieve data from a registered meter 114 occasionally, the level of success in reading the meter may be inadequate. For example, if a collector 116 attempts to read meter data from a meter 114 every 4 hours but is able to read the data, for example, only 70 percent of the time or less, it may be desirable to find a more reliable path for reading the data from that particular meter. Where the frequency of reading data from a meter 114 falls below a desired success level, the collector 116 transmits a message to the meter 114 to respond to node scans going forward. The meter 114 remains registered but will respond to node scans in the same manner as an unregistered node as described above. In other embodiments, all registered meters may be permitted to respond to node scans, but a meter will only respond to a node scan if the path to the collector through the meter that issued the node scan is shorter (i.e., less hops) than the meter's current path to the collector. A lesser number of hops is assumed to provide a more reliable communication path than a longer path. A node scan request always identifies the level of the node that transmits the request, and using that information, an already registered node that is permitted to respond to node scans can determine if a potential new path to the collector through the node that issued the node scan is shorter than the node's current path to the collector.

If an already registered meter 114 responds to a node scan procedure, the collector 116 recognizes the response as originating from a registered meter but that by re-registering the meter with the node that issued the node scan, the collector may be able to switch the meter to a new, more reliable path. The collector 116 may verify that the RSSI value of the node scan response exceeds an established threshold. If it does not, the potential new path will be rejected. However, if the RSSI threshold is met, the collector 116 will request that the node that issued the node scan perform the qualification process described above (i.e., send a predetermined number of packets to the node and count the number of acknowledgements received). If the resulting qualification score satisfies a threshold, then the collector will register the node with the new path. The registration process comprises updating the collector 116 and meter 114 with data identifying the new repeater (i.e. the node that issued the node scan) with which the updated node will now communicate. Additionally, if the repeater has not previously performed the operation of a repeater, the repeater would need to be updated to identify that it is a repeater. Likewise, the repeater with which the meter previously communicated is updated to identify that it is no longer a repeater for the particular meter 114. In other embodiments, the threshold determination with respect to the RSSI value may be omitted. In such embodiments, only the qualification of the last "hop" (i.e., sending a predetermined number of packets to the node and counting the number of acknowledgements received) will be performed to determine whether to accept or reject the new path.

In some instances, a more reliable communication path for a meter may exist through a collector other than that with which the meter is registered. A meter may automatically recognize the existence of the more reliable communication path, switch collectors, and notify the previous collector that the change has taken place. The process of switching the registration of a meter from a first collector to a second collector begins when a registered meter 114 receives a node scan request from a collector 116 other than the one with which the meter is presently registered. Typically, a registered meter 114 does not respond to node scan requests. However, if the request is likely to result in a more reliable transmission path, even a registered meter may respond. Accordingly, the meter determines if the new collector offers a potentially more reliable transmission path. For example, the meter 114 may determine if the path to the potential new collector 116 comprises fewer hops than the path to the collector with which the meter is registered. If not, the path may not be more reliable and the meter 114 will not respond to the node scan. The meter 114 might also determine if the RSSI of the node scan packet exceeds an RSSI threshold identified in the node scan information. If so, the new collector may offer a more reliable transmission path for meter data. If not, the transmission path may not be acceptable and the meter may not respond. Additionally, if the reliability of communication between the potential new collector and the repeater that would service the meter meets a threshold established when the repeater was registered with its existing collector, the communication path to the new collector may be more reliable. If the reliability does not exceed this threshold, however, the meter 114 does not respond to the node scan.

If it is determined that the path to the new collector may be better than the path to its existing collector, the meter 114 responds to the node scan. Included in the response is information regarding any nodes for which the particular meter may operate as a repeater. For example, the response might identify the number of nodes for which the meter serves as a repeater.

The collector 116 then determines if it has the capacity to service the meter and any meters for which it operates as a repeater. If not, the collector 116 does not respond to the meter that is attempting to change collectors. If, however, the collector 116 determines that it has capacity to service the meter 114, the collector 116 stores registration information about the meter 114. The collector 116 then transmits a registration command to meter 114. The meter 114 updates its registration data to identify that it is now registered with the new collector. The collector 116 then communicates instructions to the meter 114 to initiate a node scan request. Nodes that are unregistered, or that had previously used meter 114 as a repeater respond to the request to identify themselves to collector 116. The collector registers these nodes as is described above in connection with registering new meters/nodes.

Under some circumstances it may be necessary to change a collector. For example, a collector may be malfunctioning and need to be taken off-line. Accordingly, a new communication path must be provided for collecting meter data from the meters serviced by the particular collector. The process of replacing a collector is performed by broadcasting a message to unregister, usually from a replacement collector, to all of the meters that are registered with the collector that is being removed from service. In one embodiment, registered meters may be programmed to only respond to commands from the collector with which they are registered. Accordingly, the command to unregister may comprise the unique identifier of the collector that is being replaced. In response to the command to unregister, the meters begin to operate as unregistered meters and respond to node scan requests. To allow the unregistered command to propagate through the subnet, when a node receives the command it will not unregister immediately, but rather remain registered for a defined period, which may be referred to as the "Time to Live". During this time to live period, the nodes continue to respond to application layer and immediate retries allowing the unregistration command to propagate to all nodes in the subnet. Ultimately, the meters register with the replacement collector using the procedure described above.

One of collector's 116 main responsibilities within subnet 120 is to retrieve metering data from meters 114. In one embodiment, collector 116 has as a goal to obtain at least one successful read of the metering data per day from each node in its subnet. Collector 116 attempts to retrieve the data from all nodes in its subnet 120 at a configurable periodicity. For example, collector 116 may be configured to attempt to retrieve metering data from meters 114 in its subnet 120 once every 4 hours. In greater detail, in one embodiment, the data collection process begins with the collector 116 identifying one of the meters 114 in its subnet 120. For example, collector 116 may review a list of registered nodes and identify one for reading. The collector 116 then communicates a command to the particular meter 114 that it forward its metering data to the collector 116. If the meter reading is successful and the data is received at collector 116, the collector 116 determines if there are other meters that have not been read during the present reading session. If so, processing continues. However, if all of the meters 114 in subnet 120 have been read, the collector waits a defined length of time, such as, for example, 4 hours, before attempting another read.

If during a read of a particular meter, the meter data is not received at collector 116, the collector 116 begins a retry procedure wherein it attempts to retry the data read from the particular meter. Collector 116 continues to attempt to read the data from the node until either the data is read or the next subnet reading takes place. In an embodiment, collector 116 attempts to read the data every 60 minutes. Thus, wherein a subnet reading is taken every 4 hours, collector 116 may issue three retries between subnet readings.

Figure 4:
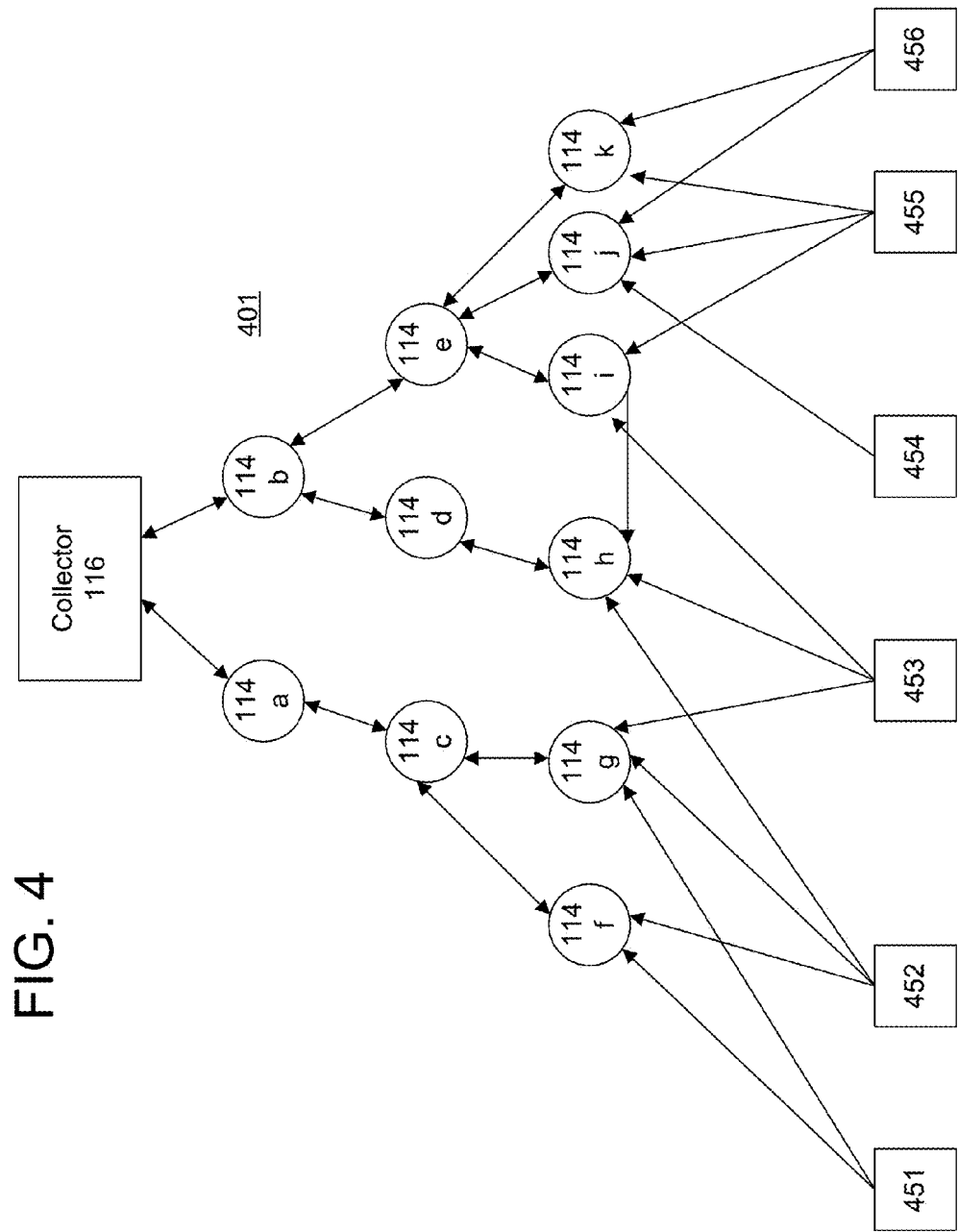
FIG. 4 is a diagram of an exemplary subnet of a wireless network for collecting data from remote devices.

Meters 114 are often two-way meters—i.e. they are operable to both receive and transmit data. However, one-way meters that are operable only to transmit and not receive data may also be deployed. FIG. 4 is a block diagram illustrating a subnet 401 that includes a number of one-way meters 451-456. As shown, meters 114a-k are two-way devices. In this example, the two-way meters 114a-k operate in the exemplary manner described above, such that each meter has a communication path to the collector 116 that is either a direct path (e.g., meters 114a and 114b have a direct path to the collector 116) or an indirect path through one or more intermediate meters that serve as repeaters. For example, meter 114h has a path to the collector through, in sequence, intermediate meters 114d and 114b. In this example embodiment, when a one-way meter (e.g., meter 451) broadcasts its usage data, the data may be received at one or more two-way meters that are in proximity to the one-way meter (e.g., two-way meters 114f and 114g). In one embodiment, the data from the one-way meter is stored in each two-way meter that receives it, and the data is designated in those two-way meters as having been received from the one-way meter. At some point, the data from the one-way meter is communicated, by each two-way meter that received it, to the collector 116. For example, when the collector reads the two-way meter data, it recognizes the existence of meter data from the one-way meter and reads it as well. After the data from the one-way meter has been read, it is removed from memory.

While the collection of data from one-way meters by the collector has been described above in the context of a network of two-way meters 114 that operate in the manner described in connection with the embodiments described above, it is understood that the present invention is not limited to the particular form of network established and utilized by the meters 114 to transmit data to the collector. For example, in some cases, the present invention may be used in the context of any network topology in which a plurality of two-way communication nodes are capable of transmitting data and of having that data propagated through the network of nodes to the collector. The present invention may also be used in other contexts such as those that do not necessarily require network communications.

Figure 5:
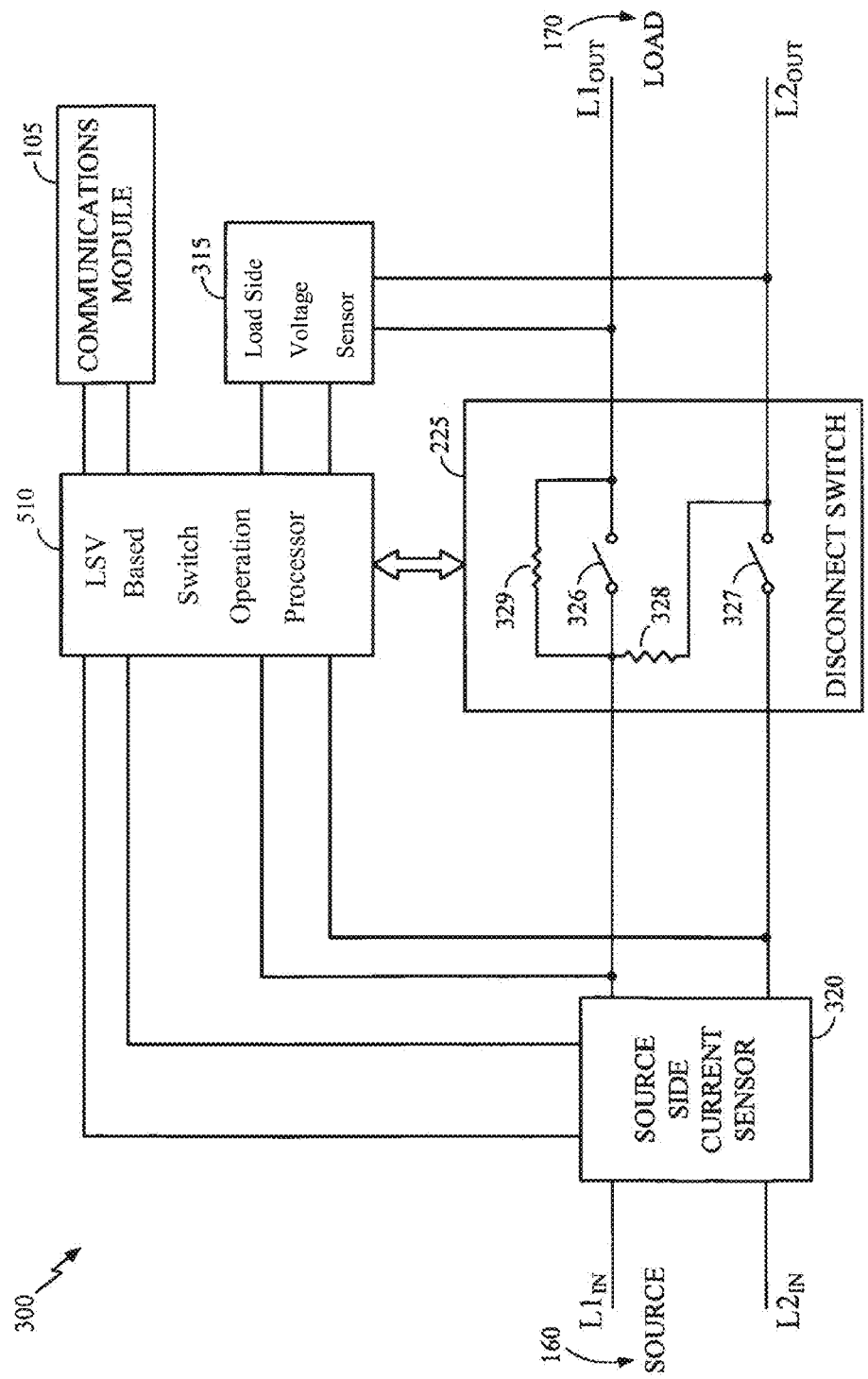
FIG. 5 is a diagram of an example power meter with a disconnect switch.

FIG. 5 displays an example power meter 300 with a disconnect switch 225. Power meter 300 is merely one example of a power meter that may be employed in association with the present disclosure, and many other power meter configurations may be employed. Power meter 300 is similar to a 2S single phase two wire, two element watt-hour meter. Those skilled in the art will recognize that the power meter 300 can be installed to measure power in a conventional 120/240 split phase electric system and in this configuration there is no neutral connection brought into the power meter 300. The power meter device 300 is designed to receive a source voltage at $L1_{IN}$ and $L2_{IN}$ at the source side 160 of the power meter 300. The source voltage may be provided from the utility power grid, typically from a transformer near the subscriber site. The source voltage received at the source side 160 of the power meter 300 typically ranges between 0 and 240 VAC. Within the power meter 300 the electrical power is routed through a current sensor 320. The current sensor 320 measures the amount of current flowing through each source side contact ($L1_{IN}$ and $L2_{IN}$) of the power meter 300. Coupled to the current sensor 320 is a service disconnect switch 225. Power is supplied to the load side 170 of the power meter 300 through the service disconnect switch 225 when the service disconnect switch 225 is closed. From the service disconnect switch 225, power is routed to the consumer via the load side contacts $L1_{OUT}$ and $L2_{OUT}$.

The load side voltage (LSV) based switch operation processor 510 (hereinafter referred to as processor 510) is coupled to the service disconnect switch 225 and may open or close the service disconnect switch 225 by opening and closing an electromechanical solenoid switch which moves the moveable contacts 326 and 327. As will be set forth in detail below, processor 510 may operate the disconnect switch based, at least in part, on a voltage at the load side of disconnect switch 225. Opening and closing the service disconnect switch 225 allows the processor 510 to connect or disconnect the consumer from the power grid. Power is supplied to the consumer when the service disconnect switch 225 is closed (the movable contacts 326 and 327 are engaged) via the load side 170 contacts $L1_{OUT}$ and $L2_{OUT}$.

The processor 510 determines power usage by measuring the voltage present at the load side contacts $L1_{OUT}$ and $L2_{OUT}$ when the service disconnect switch 225 is closed and multiplying it by the collective current measured by the current sensor 320. When the service disconnect switch 225 is open, the processor 510 monitors the load side contacts $L1_{OUT}$ and $L2_{OUT}$ to determine if an unsafe line condition exists. As is explained in subsequent sections, bypass resistors 328 and 329 are used by the load side voltage sensor 315 to monitor for unsafe line conditions.

In the power meter 300, the processor 510 monitors the current sensor 320 as well as other components within the power meter 300. The current sensor 320 output may be fed to an internal analog to digital (A/D) converter allowing the processor 510 to receive a digital representation of the amount of current flowing through the current sensor 320. The current sensor 320 may be a current transformer, shunt or the like. Alternatively, a microprocessor 510 with an internal A/D converter may receive an analog signal from the current sensor 320. In this embodiment, the current sensor 320 may send an analog signal corresponding to the amount of current flowing through the current sensor 320 and the microprocessor 510 determines the amount of current flowing by performing its own A/D conversion. Because the voltage received at the source side 160 of the power meter 300 is of the same phase, a single current transformer may be used in the current sensor 320.

Also communicating with the processor 510 is a load side voltage sensor 315. The load side voltage sensor 315 is coupled directly to the load side contacts $L1_{OUT}$ and $L2_{OUT}$ and the source side contact $L2_{IN}$. Within the load side voltage sensor 315 is a signal processing circuit which measures the voltage levels at the load side contacts $L1_{OUT}$ and $L2_{OUT}$ with respect to the source side contact $L2_{IN}$. Those skilled in the art will recognize that the Form 2S meter configuration does not include a connection to neutral or earth ground. The load side voltage sensor 315 monitors the voltage levels present at the load side 170 of the service disconnect switch 225. In one embodiment, the load side voltage sensor 315 converts the voltage levels received to a corresponding digital representation which is presented to an input of the processor 510. In an alternative embodiment, the load side voltage sensor 315 may step the measured voltage down to a level that may be presented and converted utilizing an internal A/D converter within the processor 510.

The power meter 300 has a communications module 105 which allows the utility company to communicate with the power meter 300. The communications module 105 may, for example, communicate with the utility company service center or craftsperson using, for example, some or all of the wireless communications techniques set forth above, cellular telephone technology, wired network technology and others. Such communications may, for example, allow the meter 300 to receive remotely issued instructions to open and close the service disconnect switch 225.

The utility company may monitor the conditions at the power meter 300 to detect any abnormal line conditions. For example, should a consumer not pay his/her utility bill, the utility company may decide to open the service disconnect switch 225 in the power meter 300 and disconnect the consumer from the power grid. Alternatively, the utility company may install a new power meter 300 at a new home or apartment and open the service disconnect switch 225 to keep the power meter 300 from delivering power to the new consumer until an account is set up. In either of these cases, the utility company may continue to monitor the conditions at the power meter 300 to ensure that before the service disconnect switch 225 is closed, there are no hazardous conditions on the consumer's power lines. In one illustrative example, a consumer may attempt to bypass the power meter 300 by connecting the load side 170 to the source side 160.

Figure 6:
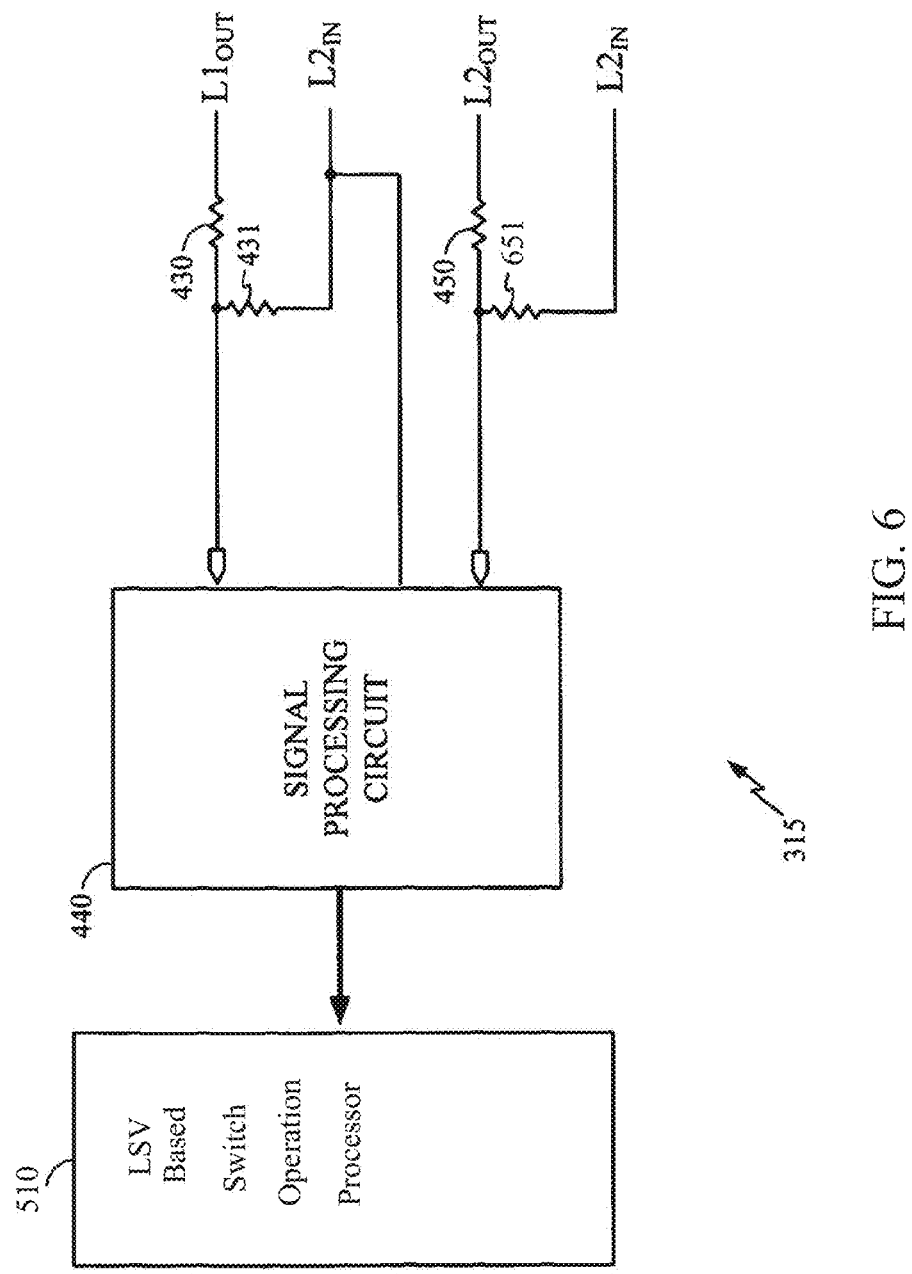
FIG. 6 is a diagram of an example load side voltage sensor.

FIG. 6 displays an example load side voltage sensor 315. Load side voltage sensor is merely one example of a load side voltage sensor that may be used in accordance with the disclosed techniques, and other components that are capable of sensing load side voltage may be employed. The example load side voltage sensor 315 receives the voltage signals present at the $L1_{OUT}$ and $L2_{OUT}$ contacts and measures them with respect to the $L2_{IN}$ contact. In this embodiment, a two input signal processing circuit 440 is used to measure the voltage levels present at the load side contacts. Those skilled in the art appreciate that the two input signal processing circuit 440 may be a digital signal processor (DSP) or the like which may be programmed to convert analog voltage signals into digital representations. Two inputs into the two input signal processing circuit 440 are used in order to facilitate the measuring of power consumption as well as possible tampering.

When the service disconnect switch 225 is closed, current may be flowing through the power meter 300. When performing power measurements, the voltage signals present at the load side contacts $L1_{OUT}$ and $L2_{OUT}$ are measured. This measurement is performed with respect to $L2_{IN}$ by utilizing the voltage divider created by the resistors 430 and 431 as well as the voltage divider created by the resistors 450 and 651. In an exemplary embodiment, resistors 431 and 651 may be a 1K Ω ½ watt resister and resistors 430 and 450 may be a 1M Ω ½ watt resister. In this embodiment, the voltages at load side contact $L1_{OUT}$ and $L2_{OUT}$ are stepped down approximately 1000:1.

During normal operation when the service disconnect switch 225 is closed, the AC voltage waveforms present at load side contact $L1_{OUT}$ is reduced to a maximum of about 0.24 VAC and presented to the one of the two inputs of the signal processing circuit 440. Typically, when the voltage at the load side contact $L1_{OUT}$ is greater than about 196 VAC, the conditions at the power meter 300 are considered to be within operating norms.

Additionally, when the service disconnect switch 225 is closed, the voltage measured at load side contact $L2_{OUT}$ with respect to $L2_{IN}$ should be approximately zero VAC. The two input signal processing circuit 440 samples these voltages and presents the voltage information to the processor 510. The processor 510 also receives the value relating to the sum of current flowing through the source side current sensor 120. Using the voltage difference measured between $L1_{OUT}$ and $L2_{OUT}$ and the sum of the current flowing through the power meter 300, the processor 510 determines and stores the amount of power the subscriber is using.

The inclusion of bypass resistors 328 and 329 (FIG. 5) allows the processor 510 to confirm that the service disconnect switch 225 is in the open position. In one embodiment, the bypass resistors 328 and 329 may be 1M Ω ½ watt resistors. Alternatively, the bypass resistors 328 and 329 may be comprised of several resistors placed in series. Using multiple resistors may provide the load side voltage sensor 315 surge protection. When the service disconnect switch 225 is open, the voltage present across the voltage divider comprised of bypass resistor 329 and resistors 430 and 431 in series is about 120 VAC with respect to L2 source (the meter reference voltage). In other words, the voltage present at $L1_{IN}$ (which is about 240 VAC), again referenced to $L2_{IN}$, is divided in half by the voltage divider which results in about 120 VAC present at $L1_{OUT}$ with respect to $L2_{IN}$. Similarly, the voltage divider created by the bypass resistor 328 and resistors 450 and 651 in series steps down the voltage present at $L2_{OUT}$ with respect to $L2_{IN}$ to about 120 VAC. Thus, when the service disconnect switch 225 is in the open position, the voltage at $L1_{OUT}$ and $L2_{OUT}$ with respect to $L2_{IN}$ is about 120 VAC. Utilizing the bypass resistors 328 and 329, and the load side voltage sensor 315, the processor 510 may confirm the status of the service disconnect switch 225. Additionally, if the voltage is significantly different than about 120 VAC when the service disconnect switch 225 is open, the processor 510 may determine a tamper condition may exist at the power meter 300. Those skilled in the art will recognize that normal residential loading conditions, either line to neutral or line to line, on the meter will not affect the normal 120 VAC readings at $L1_{OUT}$ and $L2_{OUT}$.

It is once again noted that the configurations of FIGS. 5 and 6 are merely example meter and component configurations that may be employed with the disclosed techniques. For example, other meter configurations such as 1S single phase single element, 12S two phase two element, and other configurations with or without bypass resistors may also be employed in accordance with the disclosed techniques. In some cases, a meter may include only a single load side contact on the load side of the disconnect switch. Also, in some cases, a load side voltage sensor may measure a load side voltage at only a single load side contact.

Figure 7:
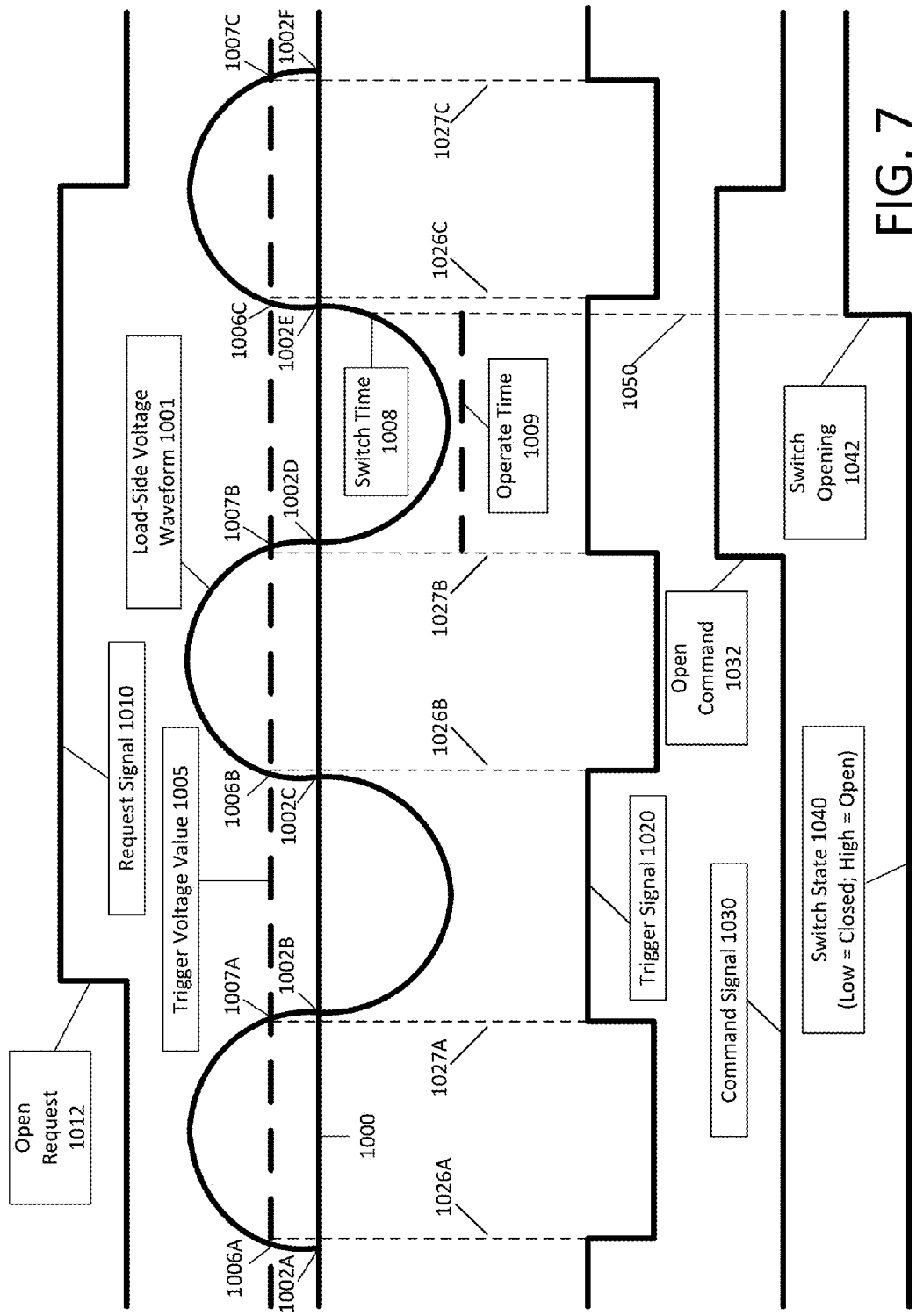
FIG. 7 is a diagram of an example timing diagram for opening a disconnect switch.

As set forth above, in some cases, the power meter disconnect switch may be operated based, at least in part, on a voltage at the load side of the disconnect switch. Some example techniques for such operation of the disconnect switch will now be set forth in detail. In particular, an example timing diagram for opening of a disconnect switch is depicted in FIG. 7. As shown, example load side voltage waveform 1001 is depicted in relation to zero axis 1000, which represents a zero voltage value. Waveform 1001 crosses zero axis 1000 at zero crossovers 1002A-F. In the particular examples of FIGS. 7 and 8, waveform 1001 is a 60 Hz waveform, which is known to have a half-cycle duration of approximately 8.33 milliseconds (msec). Accordingly, the approximate time between each zero crossover 1002A-F is 8.33 msec. Waveform 1001 corresponds to the AC voltage measured at the load side of the disconnect switch. In some cases, waveform 1001 may correspond to a load side voltage measured from at least one of one or more load side contacts on the load side of the disconnect switch. In a power meter such as example power meter 300 of FIG. 5, waveform 1001 may, for example, correspond to the voltage at $L1_{OUT}$ with respect to $L2_{IN}$. In some cases, multiple load side contacts may sometimes be capable of being measured for a load side voltage corresponding to waveform 1001.

As shown at the bottom of FIG. 7, switch state 1040 represents whether the disconnect switch is in an open or a closed state at a particular instant. Switch state 1040 is low when the disconnect switch is in the closed state, while switch state 1040 is high when the disconnect switch is in the open state. Switch state 1040 indicates that the period of time represented in FIG. 7 begins with the disconnect switch in the closed state.

An example request signal 1010 is shown at the top of FIG. 7. The request signal 1010 indicates when a request is received to open or close the disconnect switch. As set forth above, such a request may, for example, be sent to the meter from an external device such as a remote utility control component. For example, a request may be sent to open the disconnect switch when it is determined that a customer has stopped paying bills or closed an account with a utility, such as when a customer vacates a property associated with the meter. The request signal 1010 may, for example, switch from a low state to a high state when a request is received by the meter and/or one or more particular meter processing or other meter components. The request signal 1010 may then, for example, remain in the high state for a sufficient period of time to allow the disconnect switch to be opened or closed in response to the request based, for example, on the techniques set forth below. The request signal 1010 may then, for example, return to the low state.

FIG. 7 depicts an example scenario in which a meter receives a request to open the disconnect switch. Such an open request may, in some cases, be received by the meter at any given instant and need not necessarily be correlated to the occurrence of zero crossovers 1002A-F in load side voltage waveform 1001. In the particular example of FIG. 7, an open request 1012 is received just after zero crossover 1002B. It is noted however, that this is merely an example and that the open request 1012 may, in many cases, be received at any time corresponding to any point on the waveform 1001.

While the open request 1012 may be received at any time, there are, however, certain times at which opening of the disconnect switch may be particularly advantageous or disadvantageous. In particular, opening of the disconnect switch may establish arc energy that may be sustained until a subsequent zero crossover of a waveform corresponding to the AC current applied to the disconnect switch. Thus, for example, opening of the disconnect switch slightly after zero crossover of the AC current waveform may be disadvantageous because it may establish arc energy that is sustained for nearly a half-cycle of the waveform until the subsequent zero crossover. By contrast, if the disconnect switch is opened slightly before zero crossover of the AC current waveform, then the arc may be extinguished when the AC current goes to zero and may not restrike. Thus, in many cases, to minimize the amount of wear on the contacts, it may be beneficial to open the disconnect switch slightly before zero crossover of the AC current waveform. Additionally, because high current residential loads are typically close to unity power factor, the AC current zero crossovers may often occur near synchronously with the load side voltage zero crossovers 1002A-F. Accordingly, opening the disconnect switch slightly before the load side voltage zero crossovers 1002A-F may also have the effect of reducing the generated arc energy and decreasing wear on the contacts.

Accordingly, in some cases, a request 1012 to open the disconnect switch may not cause an immediate issuance of an open command, which is a command to open the disconnect switch. Rather, as opposed to issuing an immediate open command when the open request is received, the issuing of the open command may, in some cases, be delayed in order to, for example, help reduce the amount of arc energy generated by the switch opening. As shown in FIG. 7, example command signal 1030 is initiated in the low state and then switches to the high state upon issuance of the open command 1032 to open the disconnect switch. By comparing the horizontal positions (i.e., relative time) of open request 1012 and open command 1032, it is apparent that the open command 1032 is not issued immediately upon receipt of the open request 1012. Rather, the issuing of the open command 1032 is delayed. In particular, the issuing of open command 1032 is delayed until an event referred to herein as a trigger point. In general, the trigger point is a point on the load side voltage waveform 1001 associated with an issuance of a command to operate the disconnect switch, which, in the example of FIG. 7, is open command 1032. The trigger point may be determined, for example, as set forth below.

Figure 8:
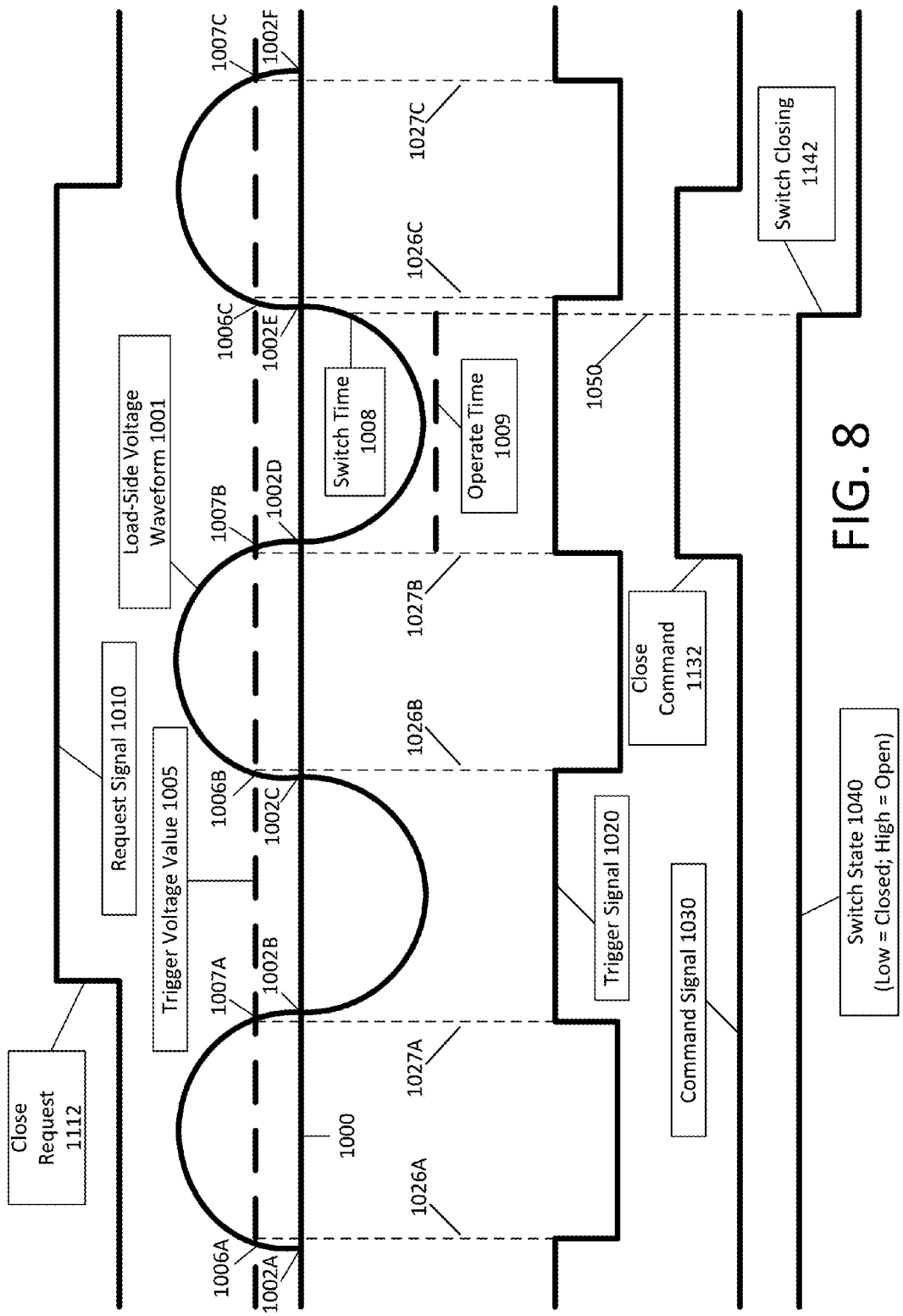
FIG. 8 is a diagram of an example timing diagram for closing a disconnect switch.

In some cases, a trigger point may be determined based, at least in part, on an operate time of the disconnect switch, which is an estimated time required to operate (i.e., open or close) the disconnect switch after issuance of an operate command (i.e., an open command or a close command). In the example of FIGS. 7 and 8, it is assumed that the operate time of the disconnect switch is approximately 8.33 msec, which is also the same duration as the half-cycle of waveform 1001. It is noted, however, that 8.33 msec is merely one example operate time and that different switches may require longer or shorter operate times.

Also, in some cases, the trigger point may be determined based, at least in part, on a switch time. The switch time is a time selected for the disconnect switch to open or close. The switch time may be selected relative to a zero crossover of the load side voltage waveform. In particular, as set forth above, it may, in some cases, be desirable to open the disconnect switch just before the load side current waveform zero crossover. As also set forth above, because high current residential loads are typically close to unity power factor, the AC current zero crossovers may often occur near synchronously with the load side voltage zero crossovers 1002A-F. Thus, in some cases, the switch time may, for example, be selected such that it occurs slightly before the load side voltage waveform zero crossover. In the particular example of FIG. 7, the switch time is selected to occur 1 msec before zero crossover of the load side voltage waveform. One example switch time 1008 is indicated in FIG. 7. In particular, the example switch time 1008 occurs 1 msec before zero crossover 1002E.

It is noted that the switch time of 1 msec before zero crossover is merely an example switch time. In some cases, the switch time may occur more or less that 1 msec before the zero crossover of the load side voltage waveform. Additionally, it is noted that, because the current waveform applied to the disconnect switch may sometimes be slightly inductive, it may sometimes slightly lag the load side voltage waveform. Accordingly, in some cases, the switch time may be selected to occur exactly at the load side voltage zero crossover or even very slightly thereafter. However, it is believed that selecting the switch time to be slightly before the load side voltage zero crossover will be advantageous in many cases because, for example, it may allow sufficient margin for error associated with approximated and/or estimated operate times. For example, in some cases, a switch time of 1 msec or less prior to a zero crossover of the AC load side voltage waveform may be used for open operations. In particular, as noted above, an example switch time of 1 msec before load side voltage zero crossover is used in the particular example of FIG. 7.

Once the operate time and the switch time are known, they can be used to calculate the trigger point. In particular, in some cases, the trigger point can be calculated by subtracting the operate time from the switch time. Thus, for example, to determine a trigger point associated with switch time 1008, the operate time of 8.33 msec can be subtracted from the switch time 1008. The operate time is indicated in FIG. 7 by element 1009, which is a dashed line representing a subtraction of 8.33 msec from switch time 1008. Thus, subtracting 8.33 msec from switch time 1008 results in moving to a point 1007B on waveform 1001.

It is noted that FIG. 7 depicts three trigger points 1007A-C. Additionally, the value of the voltage waveform 1001 at each trigger point 1007A-C is referred to as a trigger voltage value 1005 (represented in FIG. 7 by a horizontal dashed line across the waveform 1001). Each trigger point 1007A-C is used to trigger the trigger signal 1020 to switch from a low state to a high state. This is indicated by dashed lines 1027A-C extending from each respective trigger point 1007A-C to a respective point at which trigger signal 1020 switches to a high state. As shown in FIG. 7, trigger points 1007A-C are positioned at alternate occurrences of trigger voltage value 1005. In particular, trigger points 1007A-C occur as the voltage waveform 1001 is decreasing in value. Accordingly, the issuance of the open command 1032 may be based, at least in part, on alternate detections of a particular voltage value, which may be the trigger voltage value 1005.

Additionally, in the particular example of FIG. 7, the trigger voltage value 1005 is also used to trigger the trigger signal 1020 to switch from a high state to a low state. In particular, each occurrence of the trigger voltage value 1005 while the load side voltage is increasing is referred to herein as an inverse trigger point (indicated in FIG. 7 by elements 1006A-C). Each inverse trigger point 1006A-C triggers the trigger signal 1020 to switch from a high state to a low state. This is indicated by dashed lines 1026A-C extending from each respective inverse trigger point 1006A-C to a respective point at which trigger signal 1020 switches to a low state.

Thus, for example, when the open request 1012 is received, it causes the request signal 1010 to switch from a low state to a high state. This causes an open command 1032 to be issued at the next rising edge of trigger signal 1020. As shown in FIG. 7, the next rising edge of trigger signal 1020 subsequent to open request 1012 occurs in response to trigger point 1007B. The issuance of open command 1032, in turn, causes switch opening 1042 of the disconnect switch after expiration of the operating time of the disconnect switch, which, as set forth above, is approximately 8.33 msec. As also set forth above, 8.33 msec is approximately one half-cycle of the waveform 1001. The switch opening 1042 occurs slightly before the zero crossover of the load side voltage waveform 1001, as indicated by the dashed line 1050 of FIG. 7. Then, after the switch opening 1042, the request signal 1010 switches back to a low state.

Thus, some example techniques are set forth above for performing an opening of the disconnect switch based, at least in part, on the load side voltage. In addition to opening of the disconnect switch, the disconnect switch may also be closed based, at least in part, on the load side voltage. In particular, in some cases, the disconnect switch may, for example, be closed using the same or similar techniques as those described above for opening of the disconnect switch. An example disconnect switch closing timing diagram is depicted in FIG. 8. FIG. 8 is identical to FIG. 7 with the exception that open request 1012 of FIG. 7 is replaced with a close request 1112, open command 1032 of FIG. 7 is replaced with a close command 1132, switch opening 1042 of FIG. 7 is replaced with switch closing 1142 and switch state 1042 begins in a high state instead of a low state.

Similar to the open request described above, a close request to close the disconnect switch may, in some cases, be received by the meter at any given instant and need not necessarily be correlated to the occurrence of zero crossovers 1002A-F in load side voltage waveform 1001. In the particular example of FIG. 8, close request 1112 is received just after zero crossover 1002B. It is noted however, that this is merely an example and that the close request 1112 may, in many cases, be received at any time corresponding to any point on the waveform 1001.

For both opening and closing operations, in order to reduce stress on the disconnect switch, it may be desirable to open or close the disconnect switch near zero crossover when the current is at a reduced level as compared with the peak of the waveform. There are, however, some different circumstances that may sometimes be associated with switch opening conditions as compared with switch closing conditions. For example, as set forth above, opening of the disconnect switch slightly after zero crossover may be disadvantageous because it may establish arc energy that is sustained for nearly a half-cycle of the waveform until the subsequent zero crossover. By contrast, for a closing operation, current is not flowing prior to the contacts closing and arcing may typically only occur for a short time during close and during any bounce time of the contacts. As a result, for close operations, closing slightly after crossover may not present the same problems that are associated with opening slightly after zero crossover. Thus, in some cases, for close operations, the switch time 1008 may sometimes be selected such that it occurs slightly before zero crossover or slightly after zero crossover. As an example, for close operations, the switch time may be selected to be 1 msec or less prior or subsequent to each zero crossover. In either case, the low voltage condition for switch closing will not create high current and, subsequently, will not create significant arcing.

In the particular example of FIG. 8, the switch time 1008 is selected to occur 1 msec before zero crossover, and the switch time 1008 is depicted just prior to zero crossover 1002E of the load side voltage waveform 1001. However, it is once again noted that selecting the switch time to occur 1 msec before zero crossover is merely one example switch time and that different switch times may be used. It is also noted that, for close operations, trigger points 1007A-C may, in some cases, be determined using similar techniques as set forth above for open operations. In particular, in some cases, the trigger points 1007A-C for close operations can also be calculated by subtracting the operate time from the switch time. In particular, FIG. 8 depicts trigger points 1007A-C at the same locations as were used for the open operation depicted in FIG. 7. Similar to FIG. 7, FIG. 8 also specifically shows how trigger point 1007B is calculated by subtracting operate time 1009 from switch time 1008.

As shown in FIG. 8, when the close request 1112 is received, it causes switching of the request signal 1010 from a low state to a high state. This, in turn, causes an issuance of close command 1132 at the next rising edge of trigger signal 1020. As shown in FIG. 8, the next rising edge of trigger signal 1020 subsequent to close request 1112 occurs in response to trigger point 1007B. The issuance of close command 1132, in turn, causes switch closing 1142 of the disconnect switch after expiration of the operating time of the disconnect switch, which, as set forth above, is approximately 8.33 msec. As also set forth above, 8.33 msec is approximately one half-cycle of the waveform 1001. The switch closing 1142 occurs slightly before the zero crossover of the load side voltage waveform 1001, as indicated by the dashed line 1050 of FIG. 8. Then, after the switch closing 1142, the request signal 1010 switches back to a low state.

In some cases, all or portions of the example techniques depicted in FIGS. 7 and 8 may be performed by processing components that may also be used to measure power consumption and/or detect tampering and unsafe line conditions. For example, in some cases, all or portions of the example techniques depicted in FIGS. 7 and 8 may be performed by processor 510 of FIG. 5, which, as set forth above, may also be employed to measure power consumption and/or detect tampering and unsafe line conditions. For example, in some cases, processing component 510 may be employed to switch the state of request signal 1010 in response to receiving of an open or close request. Additionally, for example, processing component 510 may be employed to detect various voltage values of waveform 1001 and to responsively switch the state of trigger signal 1020. Furthermore, for example, processing component 510 may be employed to issue an open command 1032 and/or a close command 1132 by, for example, switching the state of command signal 1030.

There is no requirement, however, that processor 510 or that any other particular component perform all or any portion of the techniques depicted in FIGS. 7 and 8. In particular, in some cases, all or any portion of the techniques depicted in FIGS. 7 and 8 may be performed by, for example, a discrete circuit, a separate microcontroller and/or other components. Also, in some cases, portions of the techniques depicted in FIGS. 7 and 8 may be performed by, for example, communications module 105, load side voltage sensor 315 and/or disconnect switch 225, which may also, in some cases, be classified as processing components.

Figure 9:
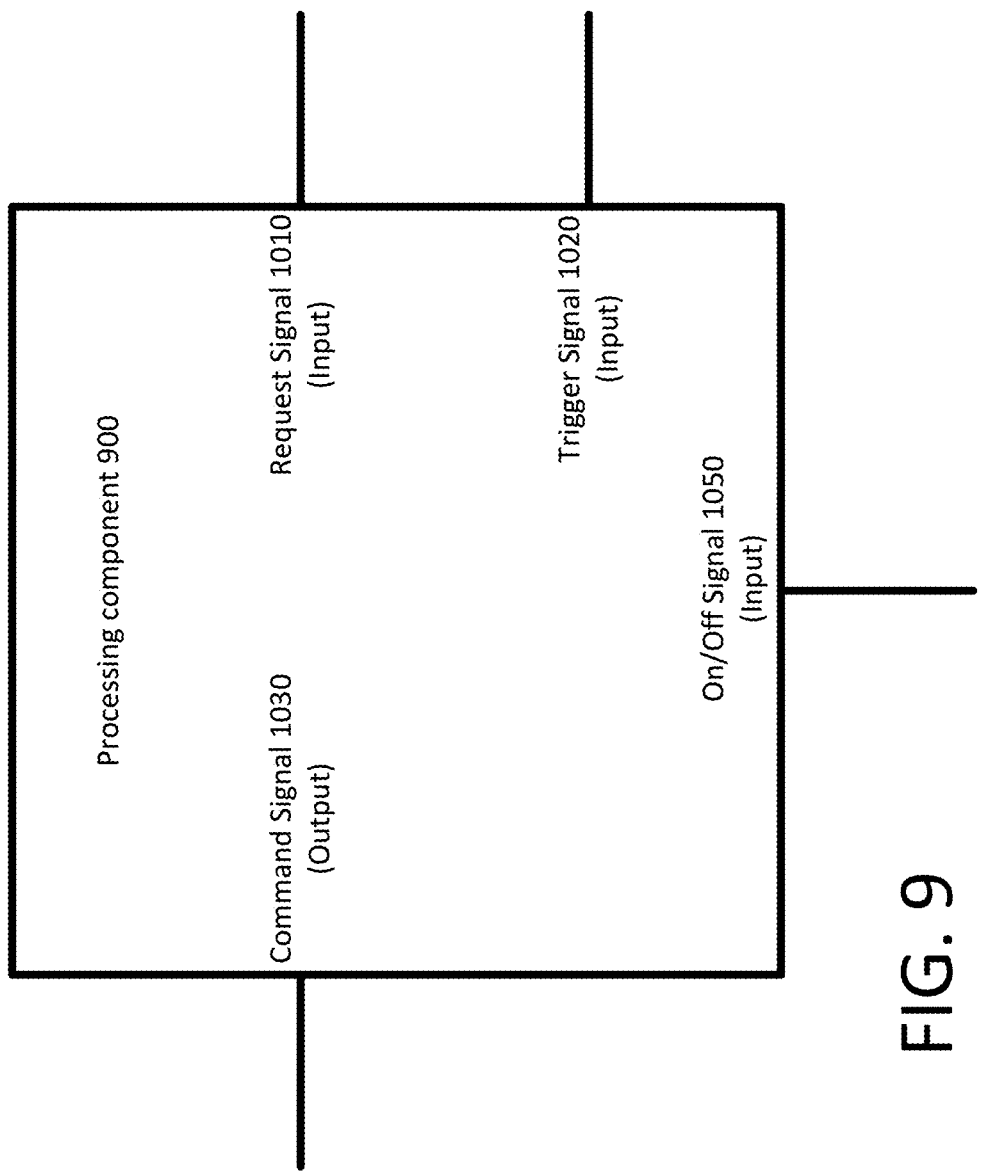
FIG. 9 is a diagram of an example circuit for operation of a disconnect switch.

FIG. 9 is a diagram of an example circuit 900 that may, in some cases, be included in a power meter for operation of a disconnect switch. Circuit 900 and/or variations thereof may, in some cases, be discrete processing components or may be sub-components that are integrated into another processing component such as processor 510. As shown in FIG. 9, circuit 900 generates an output command signal 1030, which may be sent to the meter disconnect switch. The operation of command signal 1030 is set forth above with respect to FIGS. 7 and 8. As set forth above, an open command 1032 or close command 1132 may be issued by, for example, switching the command signal 1030 from a low state to a high state. As also shown in FIG. 9, circuit 900 generates the command signal 1030 based on input signals including request signal 1010, a trigger signal 1020 and an on/off signal 1050. The operation of request signal 1010 and trigger signal 1020 are described in detail above and are not repeated here. Circuit 900 may be, for example, a D flip-flop circuit that generates output command signal 1030 based, at least in part, on using input trigger signal 1020 as a clock input.

In some cases, the request signal 1010 may be configured to switch from a high state back to a low state upon expiration of a particular time period after an open or close request is received. In some cases, the switching of request signal 1010 back to a low state may also trigger on/off signal 1050 to deactivate circuit 900. This deactivation may, in turn, also cause command signal 1030 to switch back to a low state.

It is once again noted that there is no requirement that processor 510, circuit 900 or any other particular components be employed to perform all, or any portion, of the techniques depicted in FIGS. 7 and 8. For example, in some cases, an edge sensitive port pin could be used to duplicate the functionality of a D flip-flop. It is also once again noted that the techniques shown in FIGS. 7 and 8 are merely example techniques and that other types of signals, instructions, code, commands and information may be employed by processor 510, circuit 900 and/or by any other additional or alternative components to perform the disclosed disconnect switch operation techniques. Additionally, it is noted that the depictions of signals 1010, 1020 and 1030 and state 1040 as being in a high state and/or a low state are merely intended as examples of logical states. For example, there is no requirement that command signal 1030 must switch from low to high when an open or close command is issued. Other types of logical states or signals may also be employed. Additionally, any other technique for conveying commands or information may be employed in addition or as an alternative to switching of logical states.

In some cases, the trigger voltage value 1005 may be calculated using the same techniques regardless of whether the disconnect switch is being opened or closed. As set forth above, these techniques may include, for example, selecting of the switch time and subtracting the operate time from the switch time. It is possible, however, that, in some cases, the operate time may be different depending upon whether a disconnect switch is being opened or closed. For example, in some cases, it may take longer to open a switch than to close it. Also, in some cases, different switch times could be used for open and close operations. Thus, in some cases, different trigger signals could be used for open and close operations.

In some cases, the operate time may be determined by, for example, measuring the opening and/or closing times of the disconnect switch for a given meter for a given period of time. In some cases, the opening and/or closing times may be, for example, recorded and averaged over the given time period to assist in determining the operate time. This recording of opening and/or closing times may be done by, for example, a meter processing component or by another local or remote device. The meter memory may then, for example, be configured to incorporate the appropriate operate times for the installed switch. In this manner, the close and open times may sometimes be accounted for more accurately. In one example scenario, a single operate time may be calculated and employed for both opening and closing operations. In another example scenario, different operate times may be calculated and employed for opening and closing of the switch. For example, one operate time could be used for switch openings, while a different operate time could be used for switch closings.

In both FIGS. 7 and 8, switch time 1008 occurs on the negative half-cycle of waveform 1001. It is noted, however, that continuously closing and/or opening on the same polarity can cause the mechanical contacts to develop peaks and valleys. Thus, it may sometimes be desirable to alternately open and/or close on positive and negative half cycles to avoid operating on the same voltage and/or current polarity continuously. For example, in some cases, it may desirable to have approximately half of all switch openings occur on the positive half cycle of the waveform 1001 and to have approximately half of all switch openings occur on the negative half cycle of the waveform 1001. Also, in some cases, it may desirable to have approximately half of all switch closings occur on the positive half cycle of the waveform 1001 and to have approximately half of all switch closings occur on the negative half cycle of the waveform 1001.

There are a number of example techniques that may be employed to accomplish this alternate switching functionality. For example, in some cases, approximately half of open commands 1032 and/or half of close commands 1132 may be delayed by a half-cycle duration of the load side voltage waveform. For example, as set forth above, it is known that the half-cycle duration for a 60 Hz waveform is 8.33 msec. Thus, for a 60 Hz load side voltage waveform, approximately half of open commands 1032 and half of close commands 1132 may be delayed by 8.33 msec. Accordingly, in the example of FIGS. 7 and 8, the open command 1032 and close command 1132 could be delayed such that they are not issued until 8.33 msec after trigger point 1007B. As should be appreciated, this would also result in open command 1032 and close command 1132 being pushed back by 8.33 msec such that they would occur in the positive half-cycle of the waveform 1001.

One example way to accomplish these delays would be to employ a random generator that randomly selected a positive or a negative half-cycle for each open and/or close command. In the examples of FIGS. 7 and 8, the open and/or close commands may then be delayed when the positive half-cycle is selected. In some cases, different random generators may be employed for both open and close commands in order to alternate both open and close operations approximately evenly.

Thus, as set forth above, techniques for operation of a disconnect switch based, at least in part, on a voltage at the load side of the disconnect switch are disclosed herein. As also set forth above, in addition to operation of the disconnect switch, measuring of a voltage at the load side of the disconnect switch may also be used, for example, to measure power consumption, to detect meter tampering and/or to detect an unsafe line condition. Thus, in some cases, operation of a disconnect switch based on load side voltage may be advantageous because, for example, it may allow the disconnect switch to be operated using one or more components that may also be used to perform other important functions. For example, in some cases, components such as bypass resistors 328 and 329, load side voltage sensor 315, and processor 510 may be used to assist with performance of multiple functions such as switch operation, power consumption measurement, tamper detection and unsafe line condition detection. The use of such components to perform multiple different functions may, in some cases, provide advantages such as reducing the cost and complexity associated with manufacturing and assembly of power meters. As a specific example, it is noted above that bypass resistors 328 and 329 may be used, for example, to confirm that disconnect switch is in the open position and to monitor for unsafe line conditions. Additionally, it is noted that bypass resistors 328 and 329 may also, for example, allow a voltage to be presented at the load side of the disconnect switch when the disconnect switch is open. In some cases, this may, for example, allow load side voltage to be used to make a determination of when to issue a command to close a disconnect switch that is in the open position.

Figure 10:
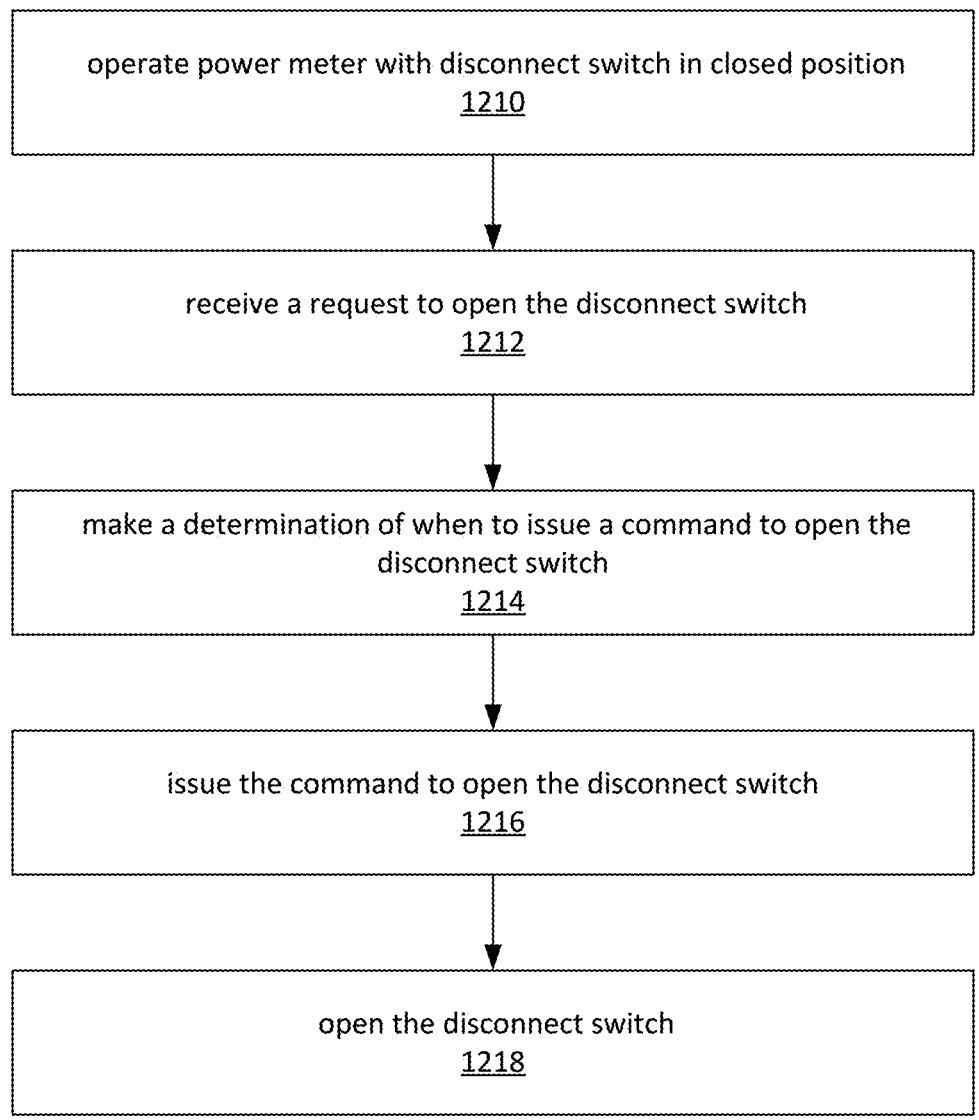
FIG. 10 is a flowchart of an example method for opening of a disconnect switch.

A flowchart of an example method for opening of a power meter disconnect switch is shown in FIG. 10. As set forth above, all, or any portion, of the operations shown in FIG. 10 may be performed by one or more components including, for example, processor 510, circuit 900, communications module 105, load side voltage sensor 315, disconnect switch 225 and/or other components. The example method is initiated at operation 1210, at which the power meter is operated with its disconnect switch in the closed position. As set forth above, when the disconnect switch is closed, power is supplied to a load side of the power meter through the disconnect switch.

At operation 1212, the power meter and/or one or more particular components within the power meter receive a request to open the disconnect switch. The request may, for example, be received directly or indirectly from an external device such as a remote utility control component. The request may, for example, be received by processing component 510 of FIG. 5, circuit 900 of FIG. 9 and/or another component via communications module 105 of FIG. 5 and/or another component. For example, a request may be sent to open the disconnect switch when it is determined that a customer has closed an account with a utility, such as when a customer vacates a property associated with the meter. As set forth above, in some cases, receiving of the request to open the disconnect switch may cause a request signal 1010 of FIG. 7 to switch from a low state to a high state.

At operation 1214, a determination is made of when to issue a command to open the disconnect switch. The determination at operation 1214 may be made by, for example, processing component 510 of FIG. 5, circuit 900 of FIG. 9 and/or another component. As set forth above, this determination may be based, at least in part, on the voltage at the load side of the disconnect switch. As also set forth above, to assist with measuring of the load side voltage, a power meter may include a component such as load side voltage sensor 315 of FIG. 3 and/or another component. In greater detail, as set forth above, the determination at operation 1214 may, for example, be based on a trigger signal that switches states based, at least in part, on the load side voltage. For example, the command may be issued based on a determination that the trigger signal has switched from a low state to a high state, which may, for example, be triggered by an occurrence of a trigger point in the AC load side voltage waveform. As also set forth above, the trigger points may, for example, be determined by selecting a switch time and subtracting an operate time from the switch time. For example, as shown in FIG. 7, trigger point 1007B can be determined by subtracting operate time 1009 from switch time 1008. The operate time may be, for example, the time estimated to be required for opening of the disconnect switch after issuance of an open command to open the disconnect switch. The switch time may be, for example, the time at which the disconnect switch is selected to be opened. As set forth above, the switch time may be selected based, at least in part, on a zero crossover of the load side voltage waveform. The switch time may, for example, be selected to occur slightly before a zero crossover of the load side voltage waveform. For example, in some cases, a switch time of 1 msec or less prior to a zero crossover of the AC load side voltage waveform may be used for open operations. In some cases, the same trigger points, operate times and/or switch times may be used for both open and close operations. In other cases, different trigger points, operate times and/or switch times may be used for open and close operations.

It is noted that the open command need not necessarily be issued immediately upon detection of the trigger signal switching to a high state. As set forth above, it may be desirable, in some cases, to delay issuance of the open command. For example, as set forth above, in order to avoid constant switch opening while the load side voltage is in a positive or a negative half cycle, it may be desirable to sometimes delay issuance of the open command by a half-cycle duration of the load side voltage waveform.

At operation 1216, an open command to open the disconnect switch is issued. The open command may, for example, be issued in accordance with the determination of operation 1214. For example, as shown in FIG. 7, the detection of trigger point 1007B causes a rising edge of the trigger signal 1020, which, in turn, causes the open command 1032 to be issued by switching the command signal 1030 from a low state to a high state. The open command may, for example, be issued by processor 510, circuit 900 and/or by another component. Upon being issued, the open command may, for example, be sent to the disconnect switch and may cause the disconnect switch to open.

At operation 1218, the disconnect switch is opened in response to the open command. As set forth above, the time period between issuance of the open command (operation 1216) and opening of the disconnect switch (operation 1218) may be approximately equal to the operate time. However, because the operate time may be an estimated time, it is possible that time period between operations 1216 and 1218 may, in some cases, be slightly shorter or slightly longer than the operate time. For the same reasons, the switch may, in some cases, actually be opened slightly before or slightly after the switch time.

Figure 11:
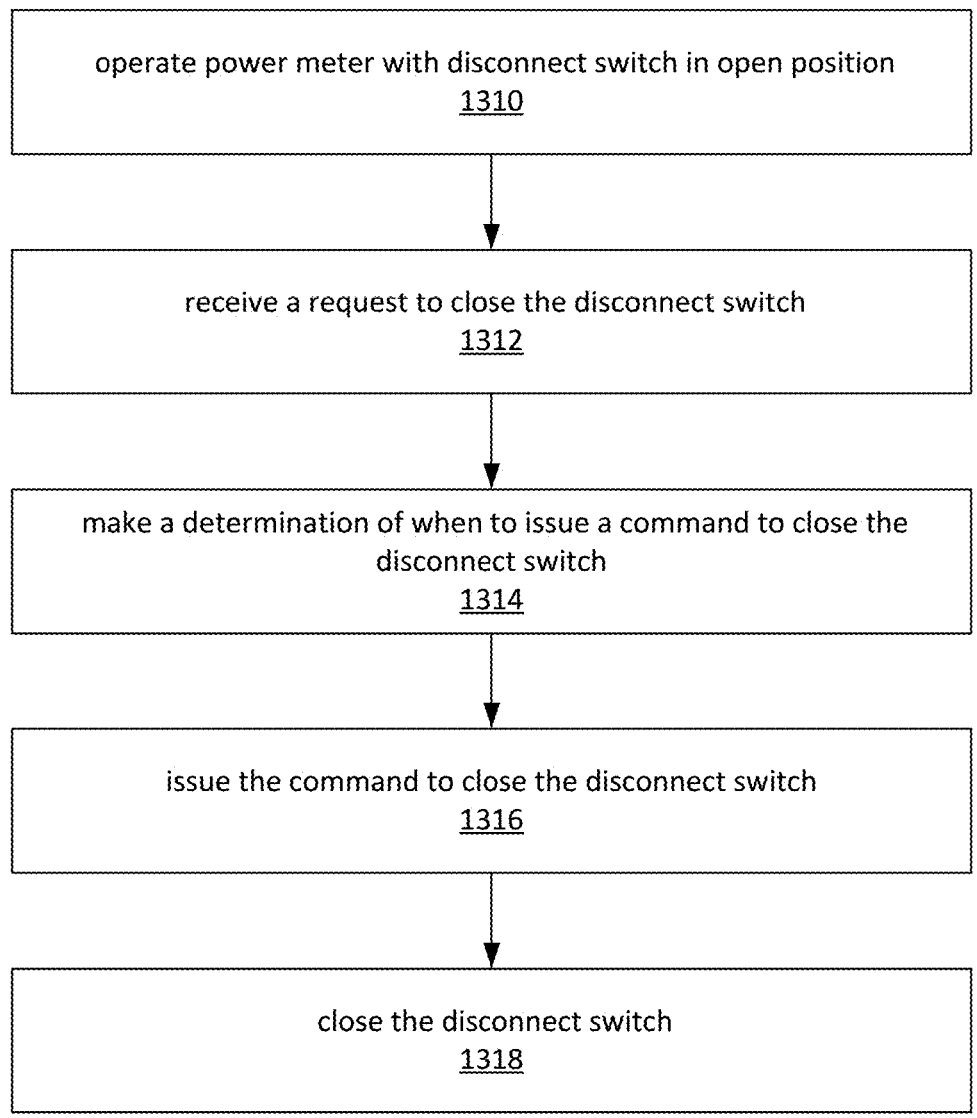
FIG. 11 is a flowchart of an example method for closing of a disconnect switch.

A flowchart of an example method for closing of a power meter disconnect switch is shown in FIG. 11. As set forth above, all, or any portion, of the operations shown in FIG. 11 may be performed by one or more components including, for example, processor 510, circuit 900, communications module 105, load side voltage sensor 315, disconnect switch 225 and/or other components. The example method is initiated at operation 1310, at which the power meter is operated with its disconnect switch in the open position. As set forth above, when the disconnect switch is open, the supply of power to a load side of the power meter is interrupted.

At operation 1312, the power meter and/or one or more particular components within the power meter receive a request to close the disconnect switch. The request may, for example, be received directly or indirectly from an external device such as a remote utility control component. The request may, for example, be received by, for example, processing component 510 of FIG. 5, circuit 900 of FIG. 9 and/or another component via communications module 105 of FIG. 5 and/or another component. For example, a request may be sent to close the disconnect switch when it is determined that a customer has opened an account with a utility, such as when a customer moves into a property associated with the meter. As set forth above, in some cases, receiving of the request to close the disconnect switch may cause a request signal 1010 of FIG. 8 to switch from a low state to a high state.

At operation 1314, a determination is made of when to issue a command to close the disconnect switch. The determination at operation 1214 may be made by, for example, processing component 510 of FIG. 5, circuit 900 of FIG. 9 and/or another component. As set forth above, this determination may be based, at least in part, on the voltage at the load side of the disconnect switch. As also set forth above, to assist with measuring of the load side voltage, a power meter may include a component such as load side voltage sensor 315 of FIG. 3 and/or another component. In greater detail, as set forth above, the determination at operation 1314 may, for example, be based on a trigger signal that switches states based, at least in part, on the load side voltage. For example, the command may be issued based on a determination that the trigger signal has switched from a low state to a high state, which may, for example, be triggered by an occurrence of a trigger point in the AC load side voltage waveform. As also set forth above, the trigger points may, for example, be determined by selecting a switch time and subtracting an operate time from the switch time. For example, as shown in FIG. 8, trigger point 1007B can be determined by subtracting operate time 1009 from switch time 1008. The operate time may be, for example, the time estimated to be required for closing of the disconnect switch after issuance of an close command to close the disconnect switch. The switch time may be, for example, the time at which the disconnect switch is selected to be closed. As set forth above, the switch time may be selected based, at least in part, on a zero crossover of the load side voltage waveform. The switch time may, for example, be selected to occur slightly before a zero crossover of the load side voltage waveform. For example, in some cases, a switch time of 1 msec or less prior or subsequent to a zero crossover of the AC load side voltage waveform may be used for close operations. In some cases, the same trigger points, operate times and/or switch times may be used for both close and close operations. In other cases, different trigger points, operate times and/or switch times may be used for close and close operations.

It is noted that the close command need not necessarily be issued immediately upon detection of the trigger signal switching to a high state. As set forth above, it may be desirable, in some cases, to delay issuance of the close command. For example, as set forth above, in order to avoid constant switch opening while the load side voltage is in a positive or a negative half cycle, it may be desirable to sometimes delay issuance of the close command by a half-cycle duration of the load side voltage waveform.

At operation 1316, a close command to close the disconnect switch is issued. The close command may, for example, be issued in accordance with the determination of operation 1314. For example, as shown in FIG. 8, the detection of trigger point 1007B causes a rising edge of the trigger signal 1020, which, in turn, causes the close command 1132 to be issued by switching the command signal 1030 from a low state to a high state. The close command may, for example, be issued by processor 510, circuit 900 and/or by another component. Upon being issued, the close command may, for example, be sent to the disconnect switch and may cause the disconnect switch to close.

At operation 1318, the disconnect switch is closed in response to the close command. As set forth above, the time period between issuance of the close command (operation 1316) and closing of the disconnect switch (operation 1318) may be approximately equal to the operate time. However, because the operate time may be an estimated time, it is possible that time period between operations 1316 and 1318 may, in some cases, be slightly shorter or slightly longer than the operate time. For the same reasons, the switch may, in some cases, actually be closed slightly before or slightly after the switch time.

As should be appreciated, in some cases, the example methods depicted in FIGS. 10 and 11 may, for example, be performed one after the other such that a disconnect switch can be successively switched from close to open and from open to close states.

Thus, as set forth above, a power meter disconnect switch may be operated based, at least in part, on sensing of the disconnect switch load side voltage. In some cases, however, the disconnect switch may additionally or alternatively be opened and/or closed based, at least in part, on current sensing. As set forth above, in some cases, to minimize the amount of wear on the contacts, it may be beneficial to operate the disconnect switch slightly before zero crossover of a current waveform applied to the disconnect switch.

As an example, in some cases, the disconnect switch may be opened and/or closed based, at least in part, on sensing of current on the source-side of the disconnect switch. In particular, as set forth above, a power meter may, in some cases, include a source-side current sensor such as source side current sensor 320 of FIG. 5. Such a source-side current sensor may, for example, be employed to sense the source-side current and to open and/or close the disconnect switch based on the sensed source-side current. This current-based switching may be, for example, implemented using a current waveform in combination with the timing techniques set forth above with respect to FIGS. 7 and 8 for determination of when to issue open and close commands.

It is further noted, that, in some cases, a source-side current sensor may be connected to one or more processing components that may be capable of detecting various current values for purposes such as determining power consumption. Such processing components may also, in some cases, be capable of issuing commands to open and/or close the disconnect switch. For example, as set forth above with respect to FIG. 5, example source-side current sensor 320 is connected to an example processor 510 that may determine power usage based, in part, on the current measured by the current sensor 320. As also as set forth above with respect to FIG. 5, example processor 510 may also be used to open and/or close the disconnect switch. In these cases, processing components such as example processor 510 may be provided with processor-executable instructions for performing some or all of the processing operations for opening and/or closing the disconnect switch based on sensed current. This may, in some cases, be advantageous by allowing the current-based disconnect switch operation to be performed using components that also may be employed to, for example, measure power consumption and detect tampering and unsafe line conditions.

In addition to a source-side current sensor, a load side current sensor may additionally or alternatively be employed for current-based disconnect switch operation. For example, referring back to FIG. 5, an additional load side current sensor could be connected to processor 510 and to the load side contacts $L1_{OUT}$ and $L2_{OUT}$. Such a load side current sensor may, for example, include any of the same or similar components included in example source-side current sensor 320 as set forth above. It is further noted that the techniques set forth above for alternating positive half cycle and negative half cycle openings may be used for current waveform based operation of the disconnect switch as well as voltage waveform based operation of the disconnect switch. For example, a random generator may be employed to randomly select a positive or a negative half-cycle of the current waveform for each open and/or close command.

All or portions of the subject matter disclosed herein may be embodied in hardware, software, or a combination of both. When embodied in software, the methods and apparatus of the subject matter disclosed herein, or certain aspects or portions thereof, may be embodied in the form of program code (e.g., computer executable instructions). This program code may be stored on a computer-readable medium, such as a magnetic, electrical, or optical storage medium, including without limitation, a floppy diskette, CD-ROM, CD-RW, DVD-ROM, DVD-RAM, magnetic tape, flash memory, hard disk drive, or any other machine-readable storage medium, wherein, when the program code is loaded into and executed by a machine, such as a computer or server, the machine becomes an apparatus for practicing the invention. A device on which the program code executes will generally include a processor, a storage medium readable by the processor (including volatile and non-volatile memory and/or storage elements), at least one input device, and at least one output device. The program code may be implemented in a high level procedural or object oriented programming language. Alternatively, the program code can be implemented in an assembly or machine language. In any case, the language may be a compiled or interpreted language. When implemented on a general-purpose processor, the program code may combine with the processor to provide a unique apparatus that operates analogously to specific logic circuits.

While systems and methods have been described and illustrated with reference to specific embodiments, those skilled in the art will recognize that modification and variations may be made without departing from the principles described above and set forth in the following claims. Accordingly, reference should be made to the following claims as describing the scope of the present invention.

What is claimed is:

1. A system for operating a disconnect switch based, at least in part, on a load side voltage in a power meter coupled to a voltage source through a first and second source side contacts, the power meter coupled to a load through a first and second load side contacts, the power meter measuring power flowing from the voltage source to the load, the system comprising:
   the disconnect switch interposed between the first source side contact and the first load side contact and between the second source side contact and the second load side contact, the disconnect switch interrupting a flow of power from the voltage source to the load when the disconnect switch is in an open position;
   a first bypass resistor coupled between the first source side contact and the first load side contact, a second bypass resistor coupled between the first source side contact and the second load side contact,
   a load side voltage sensor coupled to the first load side contact and the second load side contact, the load side voltage sensor measuring a first load side voltage from the first load side contact and measuring a second load side voltage from the second load side contact; and
   one or more processing components that perform operations comprising:
      receiving a request to close the disconnect switch;
      making a determination, based, at least in part, on the first load side voltage, of when to issue a command to close the disconnect switch, wherein the determination is based, at least in part, on a time selected for the disconnect switch to close, wherein the selected time is 1 millisecond or less prior or subsequent to an occurrence of a zero crossover of a waveform corresponding to the first load side voltage; and
      issuing the command to close the disconnect switch.

2. The system of claim 1, wherein the determination is based, at least in part, on alternate detections of the first load side voltage reaching a particular voltage value.

3. The system of claim 1, wherein the disconnect switch is closed on a plurality of occasions, wherein, for at least some of the plurality of occasions, the disconnect switch is closed while a waveform corresponding to the first load side voltage is in a positive half cycle, and wherein, for at least some other of the plurality of occasions, the disconnect switch is closed while the waveform corresponding to the first load side voltage is in a negative half cycle.

4. The system of claim 3, wherein a random value generator is used to determine whether the disconnect switch is closed while the waveform corresponding to the first load side voltage is in a positive half cycle or is in a negative half cycle.

5. The system of claim 1, wherein the one or more processing components use the first load side voltage and the second load side voltage to determine whether at least one of a tampering condition or an unsafe line condition has occurred.

6. A system for operating a disconnect switch based, at least in part, on a load side voltage in a power meter coupled to a voltage source through one or more source side contacts, the power meter coupled to a load through one or more load side contacts, the power meter measuring power flowing from the voltage source to the load, the system comprising:
- the disconnect switch interposed between the one or more load side contacts and the one or more source side contacts, the disconnect switch interrupting a flow of power from the one or more source side contacts to the one or more load side contacts when the disconnect switch is in an open position;
- a load side voltage sensor that measures the load side voltage from at least one of the one or more load side contacts; and
- one or more processing components that perform operations comprising:
  - receiving a request to open the disconnect switch;
  - making a determination, based, at least in part, on the load side voltage, of when to issue a command to open the disconnect switch, wherein the determination is based, at least in part, on a time selected for the disconnect switch to open, wherein the selected time is 1 millisecond or less prior to an occurrence of a subsequent zero crossover of a waveform corresponding to the load side voltage; and
  - issuing the command to open the disconnect switch.

7. The system of claim 6, wherein the determination is based, at least in part, on alternate detections of the load side voltage reaching a particular voltage value.

8. The system of claim 6, wherein the disconnect switch is opened on a plurality of occasions, wherein, for at least some of the plurality of occasions, the disconnect switch is opened while a waveform corresponding to the load side voltage is in a positive half cycle, and wherein, for at least some other of the plurality of occasions, the disconnect switch is opened while the waveform corresponding to the load side voltage is in a negative half cycle.

9. The system of claim 8, wherein a random value generator is used to determine whether the disconnect switch is opened while the waveform corresponding to the load side voltage is in a positive half cycle or is in a negative half cycle.

10. The system of claim 6, wherein the one or more processing components use the load side voltage to determine that at least one of a tampering condition or an unsafe line condition has occurred.

11. The system of claim 6, wherein the power meter further comprises a current sensor, and wherein the one or more processing components use measurements obtained by the current sensor to both measure power consumption and to assist in determining when to issue a command to open the disconnect switch.

12. A method for operating a disconnect switch based, at least in part, on a load side voltage in a power meter coupled to a voltage source through a first and second source side contacts, the power meter coupled to a load through a first and second load side contacts, the power meter measuring power flowing from the voltage source to the load, the method comprising:
- receiving a request to close the disconnect switch, wherein the disconnect switch is interposed between the first source side contact and the first load side contact and between the second source side contact and the second load side contact, the disconnect switch interrupting a flow of power from the voltage source to the load when the disconnect switch is in an open position;
- making a determination, based at least in part on a first load side voltage, of when to issue a command to close the disconnect switch, wherein a first bypass resistor is coupled between the first source side contact and the first load side contact, wherein a second bypass resistor is coupled between the first source side contact and the second load side contact, and wherein a load side voltage sensor is coupled to the first load side contact and the second load side contact, the load side voltage sensor measuring the first load side voltage from the first load side contact and measuring a second load side voltage from the second load side contact;
- issuing the command to close the disconnect switch; and
- closing the disconnect switch in response to the command to close the disconnect switch, wherein the disconnect switch is closed on a plurality of occasions, wherein, for at least some of the plurality of occasions, the disconnect switch is closed while a waveform corresponding to the first load side voltage is in a positive half cycle, and wherein, for at least some other of the plurality of occasions, the disconnect switch is closed while the waveform corresponding to the first load side voltage is in a negative half cycle.

13. The method of claim 12, wherein the determination is based, at least in part, on alternate detections of the first load side voltage reaching a particular voltage value.

14. The method of claim 12, wherein the determination is based, at least in part, on a time selected for the disconnect switch to close, wherein the selected time is 1 msec or less prior or subsequent to an occurrence of a subsequent zero crossover of a waveform corresponding to the first load side voltage.

15. The method of claim 12, wherein a random value generator is used to determine whether the disconnect switch is closed while the waveform corresponding to the first load side voltage is in a positive half cycle or is in a negative half cycle.

16. The method of claim 12, further comprising:
- using the first load side voltage and the second load side voltage to determine whether at least one of a tampering condition or an unsafe line condition has occurred.

17. The method of claim 12, further comprising:
- receiving a request to open the disconnect switch;
- making a determination, based at least in part on the first load side voltage, of when to issue a command to open the disconnect switch;
- issuing the command to open the disconnect switch; and
- opening the disconnect switch in response to the command to open the disconnect switch.

\* \* \* \* \*